United States Patent
Kim et al.

(10) Patent No.: US 10,854,614 B2
(45) Date of Patent: Dec. 1, 2020

(54) SEMICONDUCTOR DEVICE AND METHOD OF MANUFACTURING THE SAME

(71) Applicant: SAMSUNG ELECTRONICS CO., LTD., Suwon-si, Gyeonggi-do (KR)

(72) Inventors: Pyung-Ho Kim, Seoul (KR); Seong-Mo Koo, Seoul (KR); Kuk-Han Yoon, Suwon-si (KR); Ki-Youl Kim, Seoul (KR); Yong-Hwan Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 64 days.

(21) Appl. No.: 16/203,692

(22) Filed: Nov. 29, 2018

(65) Prior Publication Data
US 2019/0198506 A1  Jun. 27, 2019

(30) Foreign Application Priority Data

Dec. 22, 2017 (KR) ................. 10-2017-0177712
Jun. 27, 2018 (KR) ................. 10-2018-0073791

(51) Int. Cl.
*H01L 27/108* (2006.01)
*H01L 21/3213* (2006.01)

(52) U.S. Cl.
CPC .. *H01L 27/10852* (2013.01); *H01L 27/10814* (2013.01); *H01L 27/10876* (2013.01); *H01L 27/10885* (2013.01); *H01L 27/10888* (2013.01); *H01L 27/10891* (2013.01); *H01L 21/32134* (2013.01); *H01L 21/32135* (2013.01); *H01L 21/32139* (2013.01); *H01L 27/10823* (2013.01)

(58) Field of Classification Search
CPC ......... H01L 27/10852; H01L 27/10814; H01L 27/10876; H01L 27/10885; H01L 27/10888; H01L 27/10891
See application file for complete search history.

(56) References Cited

U.S. PATENT DOCUMENTS

| | | | |
|---|---|---|---|
| 7,067,385 B2* | 6/2006 | Manning | H01L 27/10817 257/E21.648 |
| 7,244,649 B2* | 7/2007 | Lee | H01L 28/91 257/E21.019 |
| 7,459,745 B2* | 12/2008 | Lee | H01L 27/10852 257/303 |
| 7,727,837 B2* | 6/2010 | Gruening-von Schwerin | H01L 28/91 438/253 |

(Continued)

FOREIGN PATENT DOCUMENTS

KR  10-2012-0050327 A  5/2012

*Primary Examiner* — Earl N Taylor
(74) *Attorney, Agent, or Firm* — Lee IP Law, P.C.

(57) ABSTRACT

Disclosed are semiconductor devices and methods of manufacturing the same. A support layer and a mold layer are partially etched off from the substrate, to form a mold pattern and a support pattern on the substrate such that a contact hole is formed through the support pattern and the mold pattern and an interconnector is exposed therethrough. A lower electrode layer is formed on the mask pattern to fill the contact hole, and a lower electrode is formed in the contact hole by partially removing the lower electrode layer and the mask pattern. The lower electrode is contact with the interconnector and is supported by the support pattern having the same thickness as the support layer.

20 Claims, 23 Drawing Sheets

(56) References Cited

U.S. PATENT DOCUMENTS

| | | | |
|---|---|---|---|
| 8,815,697 B2* | 8/2014 | Yoon | H01L 28/90 |
| | | | 438/396 |
| 9,263,536 B2* | 2/2016 | Kim | H01L 29/4236 |
| 2004/0137680 A1* | 7/2004 | Matsumura | H01L 27/10814 |
| | | | 438/255 |
| 2009/0121315 A1* | 5/2009 | Baars | H01L 28/90 |
| | | | 257/535 |
| 2009/0294907 A1* | 12/2009 | Tegen | H01L 28/86 |
| | | | 257/535 |
| 2013/0147048 A1* | 6/2013 | Kuh | H01L 23/49827 |
| | | | 257/768 |
| 2017/0077102 A1* | 3/2017 | Kim | H01L 27/10814 |
| 2017/0224602 A1 | 8/2017 | Laporta Alcantara et al. | |
| 2019/0198506 A1* | 6/2019 | Kim | H01L 27/10891 |

\* cited by examiner

US 10,854,614 B2

SEMICONDUCTOR DEVICE AND METHOD OF MANUFACTURING THE SAME

CROSS-REFERENCE TO RELATED APPLICATION

Korean Patent Application No. 10-2017-0177712, filed on Dec. 22, 2017, and Korean Patent Application No. 10-2018-0073791, filed on Jun. 27, 2018, and entitled: "Semiconductor Device and Method of Manufacturing the Same," in the Korean Intellectual Property Office are incorporated by reference herein in their entirety.

BACKGROUND

1. Field

Example embodiments relate to a semiconductor device and method of manufacturing the same, and more particularly, to a dynamic random access memory (DRAM) device having capacitors and a method of manufacturing the same.

2. Description of the Related Art

Recent DRAM devices tend to require high performance and operation speed together with a small size. For that reason, the lower electrode of the capacitor of the DRAM device may be formed to be as high as possible so as to increase the capacitance of the capacitor on a limited size of the silicon substrate.

SUMMARY

According to exemplary embodiments, there is provided a method of manufacturing a semiconductor device, including sequentially forming a mold layer, a support layer, and a mask pattern on a whole surface of a substrate, the substrate having a cell area defined by a core area, and a lower conductive structure and at least one interconnector in contact with the lower conductive structure being on the cell area of the substrate under the mold layer, partially removing the support layer and the mold layer by an etching process using the mask pattern as an etching mask to form a mold pattern and a support pattern on the mold pattern, such that a contact hole is formed through the support pattern and the mold pattern to expose the at least one interconnector in the cell area, forming a lower electrode layer on the mask pattern to fill up the contact hole, such that the lower electrode layer is in contact with the interconnector in the contact hole, and forming a lower electrode for a capacitor in the contact hole by partially removing the lower electrode layer and removing the mask pattern such that the lower electrode may be supported by the support pattern having a substantially same thickness as the support layer.

According to exemplary embodiments, there is provided another method of manufacturing a semiconductor device. A mold layer having no boron (B), a support layer and a mask pattern may be sequentially formed on a whole surface of a substrate having a cell area defined by a core area such that at least a lower conductive structure and at least an interconnector making contact with the lower conductive structure may be arranged on the cell area. The support layer and the mold layer may be partially removed from the substrate by an etching process using the mask pattern as an etching mask, thereby forming a mold pattern and a support pattern on the mold pattern such that a contact hole may be formed through the support pattern and the mold pattern and the interconnector may be exposed through the contact hole in the cell area. Then, the mask pattern may be removed from the support pattern by a radical dry cleaning (RDC) process without any substantial damages to the support pattern, and a lower electrode layer may be formed on the support pattern to a thickness to fill up the contact hole. A lower electrode for a capacitor may be formed to make contact with the interconnector in the contact hole by partially removing the lower electrode layer without any substantial damages to the support pattern.

According to exemplary embodiments, there is provided a semiconductor device including a substrate, a memory cell structure on the substrate, an interconnector connected to the memory cell structure, and a charge storage structure connected to the interconnector and selectively storing electric charges. In such a case, the charge storage structure may include a lower electrode connected to the interconnector and supported by at least a support such that the lower electrode protrudes from the support, a dielectric layer on upper and side surfaces of the lower electrode and an upper surface of the support, and an upper electrode on the dielectric layer.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1A:
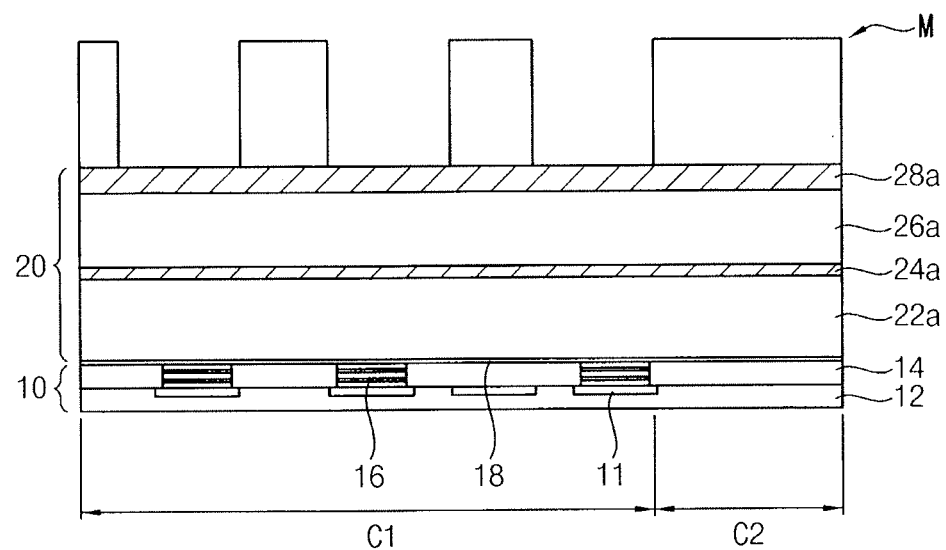
FIGS. 1A to 1J illustrate cross-sectional views of stages in a method of forming a capacitor for semiconductor devices in accordance with embodiments.

Reference will now be made to example embodiments, which are illustrated in the accompanying drawings, wherein like reference numerals refer to like components throughout.

FIGS. 1A to 1J are cross-sectional views illustrating stages in a method of forming a capacitor for semiconductor devices in accordance with a first example embodiment.

Referring to FIG. 1A, a substrate 10, e.g., a silicon wafer, may be provided in such a configuration that the substrate 10 may include a cell area C1 and a core area C2, and at least a lower conductive structure 11 and at least an interconnector 16 may be arranged on the cell area C1. A number of mold layers 22a and 26a and a number of support layers 24a and 28a may be alternately formed on a whole surface of the substrate 10. Thus, a stacked insulation layer 20 may be formed on the substrate 10, i.e., the stacked insulation layer 20 may include the alternating mold and support layers.

For example, the substrate 10 may include a substrate body 12 on which a plurality of the lower conductive structures 11 may be positioned, e.g., adjacent to each other along the horizontal direction, and a lower insulation layer 14 covering the lower conductive structures 11 and the substrate body 12. The lower conductive structures 11 may be insulated from one another by the lower insulation layer 14. A plurality of the interconnectors 16, e.g., a plurality of contact pads, may be arranged on, e.g., through, the lower insulation layer 14 and may be in contact with the lower conductive structures 11, respectively, through the lower insulation layer 14.

The substrate body 12 may include a bulk substrate, e.g., a silicon substrate, a gallium arsenide (Ga—As) substrate, a silicon germanium (Si—Ge) substrate, a ceramic substrate, a quartz substrate, and a glass substrate for a flat panel display device, and/or a multilayered substrate, e.g., a semiconductor on insulator (SOI) substrate. In the present example embodiment, the substrate body 12 may include a silicon wafer.

A series of semiconductor manufacturing processes may be performed on the substrate body 12 and the lower conductive structures 11, e.g., the transistors may be formed on the substrate body 12. Then, the lower insulation layer 14 may be formed on the lower conductive structures 11, and the interconnector 16 may be connected to each of the lower conductive structures 11 through the lower insulation layer 14. Thus, the lower conductive structures 11 may be connected to an upper conductive structure via the interconnector 16. For example, in the present example embodiment, the lower conductive structures 11 may include source and drain electrodes of the transistor, and the interconnector 16 may include a buried contact that may be connected to a capacitor 90 in FIG. 1K.

A plurality of cell memory structures may be arranged on the cell area C1 of the substrate 10, and a plurality of subsidiary structures, e.g., driving circuits for driving the cell memory structures and logic circuits for controlling the cell memory structures, may be arranged on the core area C2 of the substrate 10. A plurality of cell transistors may be arranged into a matrix shape on the cell area C1 and at least a core transistor for the driving circuit or the logic circuit may be arranged on the core area C2.

The insulation layer 20 may be formed on the whole surface of the substrate 10 having the cell area C1 and the core area C2. For example, the first mold layer 22a, the first support layer 24a, the second mold layer 26a, and the second support layer 28a may be sequentially formed on the substrate 10.

For example, an etch stopper 18 may be formed, e.g., continuously, on the lower insulation layer 14 and on the interconnector 16, and the first mold layer 22a, the first support layer 24a, the second mold layer 26a, and the second support layer 28a may be sequentially formed on the etch stopper 18 by a deposition process. The etch stopper 18 may have an etch selectivity with respect to the first and the second mold layers 22a and 26a. In the present example embodiment, the etch stopper 18 may include, e.g., a silicon nitride layer, that may be formed by a chemical vapor deposition (CVD) process.

The first mold layer 22a may be formed, e.g., directly, on the etch stopper 18 and may include, e.g., silicon oxide. Examples of the silicon oxide for the first mold layer 22a may include flowable oxide (FOX), tonen silazen (TOSZ), undoped silica glass (USG), borosilica glass (BSG), phosphosilica glass (PSG), borophosphosilica glass (BPSG), plasma enhanced tetra ethyl ortho silicate (PE-TEOS), fluoride silicate glass (FSG), plasma enhanced oxide (PEOX), high density plasma CVD (HDP-CVD) oxide, etc. These may be used alone or in combinations thereof.

The first support layer 24a may be formed on the first mold layer 22a to an appropriate thickness in consideration of the height of the contact hole H to be formed in a subsequent process described in FIG. 1B below, as well etching process time of the contact hole H. For example, the first support layer 24a may be formed to such a thickness that the thickness of the first support layer 24a may have a predetermined ratio with respect to the thicknesses of the first and the second mold layers 22a and 26a.

The first support layer 24a may have an etching selectivity with respect to the first and the second mold layers 22a and 26a. For example, when the first and the second mold layers 22a and 26a include an oxide, the first support layer 24a may include at least one of silicon oxynitride, silicon nitride, and silicon carbon nitride.

The second mold layer 26a may be formed on the first support layer 24a and may include the same materials as the first mold layer 22a. For example, the second mold layer 26a may include PE-TEOS or HDP-CVD oxide. Otherwise, some dopants may be doped into the second mold layer 26a, and the second mold layer 26a may have a dopant concentration different from that of the first mold layer 22a. In such a case, the second mold layer 26a may have an etch rate different from that of the first mold layer 22a.

The second support layer 28a may be formed on the second mold layer 26a and may have a single layer structure or a multilayer structure. Particularly, when the support layer 28a is formed as the multilayer structure, the shape of the contact hole H may be changed according to thickness combination of component layers of the second support layer 28a, so that each thickness of the component layers of the second support layer 28a may be determined in view of the configurations of the contact hole H. In the present example embodiment, the second support layer 28a may include, e.g., silicon nitride or silicon oxynitride.

In the present example embodiment, the insulation layer 20 may be formed into a multilayer structure in which the first and the second mold layers 22a and 26a may be stacked alternately with the first and the second support layers 24a and 28a. However, the insulation layer 20 may also include a single mold layer and a single support layer according to the characteristics and configurations of the capacitor 90. Particularly, when two or more support layers are provided with the capacitor of the semiconductor device, the exemplary embodiments may be principally applicable to an uppermost support layer that may be exposed in a subsequent process for forming the lower electrode.

Thereafter, a mask pattern M may be formed on the insulation layer 20. The mask pattern M may have etch selectivity with respect to the first and the second mold layers 22a and 26a and the first and the second support layers 24a and 28a. Thus, the mask pattern M may function as an etching mask for a subsequent etching process for forming the contact hole H. Thus, the mask pattern M may be patterned in such a way that the portion of the support layer 28a over the interconnector 16 may be exposed.

For example, the mask pattern M may include a photoresist pattern including a photoresist material or a hard mask pattern including polysilicon. In the present example embodiment, the mask pattern M may include polysilicon.

Figure 1B:
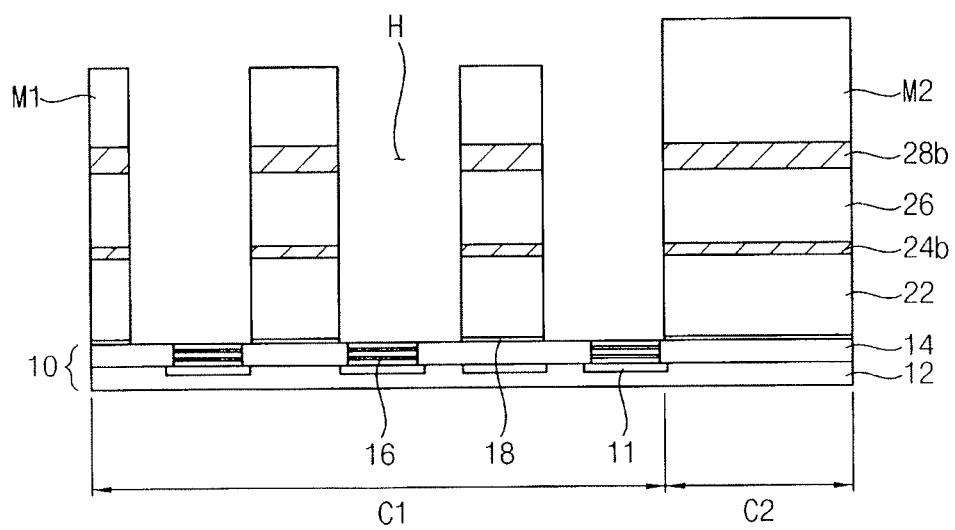

Referring to FIG. 1B, the first and the second mold layers 22a and 26a and the first and the second support layers 24a and 28a may be partially removed from the substrate 10, by using the mask pattern M as an etch mask, thereby forming the contact hole H through which the interconnector 16 may be exposed in the cell area C1. Thus, the first and the second mold layers 22a and 26a may be formed into a first mold pattern 22 and a second mold pattern 26, respectively, and the first and the second support layers 24a and 28a may be formed into a first support pattern 24b and a second support pattern 28b, respectively.

For example, a dry etching process may be conducted on the insulation layer 20 using the mask pattern M as an etching mask. The etching gases for the dry etching process may be changed in view of the compositions of the insulation layer 20. For example, when the first and the second support layers 24a and 28a are removed from the substrate 10, nitride removal gases may be selected as the etching gases for the dry etching process. In contrast, when the first and the second mold layers 22a and 26a are removed from the substrate 10, oxide removal gases may be selected as the etching gases for the dry etching process. The etch stopper 18 may also be removed from the substrate 10 by the dry etching process using the nitride removal gases as the etching gases similar to the etching process against the first and the second support layers 24a and 28a. For example, the second support layer 28a, the second mold layer 26a, the first support layer 24a, the first mold layer 22a, and the etch stopper 18 may be dry etched sequentially in the stated order by alternating the etching gasses through the mask pattern M, until the interconnector 16 is exposed through the resultant hole H.

Accordingly, the contact hole H may be formed in the insulation layer 20, and the interconnector 16 may be exposed through the contact hole H. During the dry etching process, the mask pattern M may also be slightly removed from the substrate 10, and the mask pattern M may be formed into a first mask pattern M1 that may be formed on the second support pattern 28b in the cell area C1 and a second mask pattern M2 that may be formed on the second support pattern 28b in the core area C2. Each of the first and the second mask patterns M1 and M2 may have a slightly smaller thickness than the mask pattern M.

In detail, a plurality of the interconnectors 16 in the cell are C1, which may be individually connected to a plurality of the transistors, may be densely arranged in a matrix shape at a relatively high density. In contrast, at least a core interconnector in the core area C2, which may be connected to a core transistor, may be arranged sparsely at a relatively small density. Thus, the mask pattern M may be more intensively etched off in the cell area C1 than in the core area C2, e.g., due to a larger number of interconnectors therein, so that the first mask pattern M1 may be formed into a relatively small thickness and the second mask pattern M2 may be formed into a relatively large thickness, i.e., the first mask pattern M1 may have a smaller thickness along the vertical direction than the second mask pattern M2.

Figure 1C:
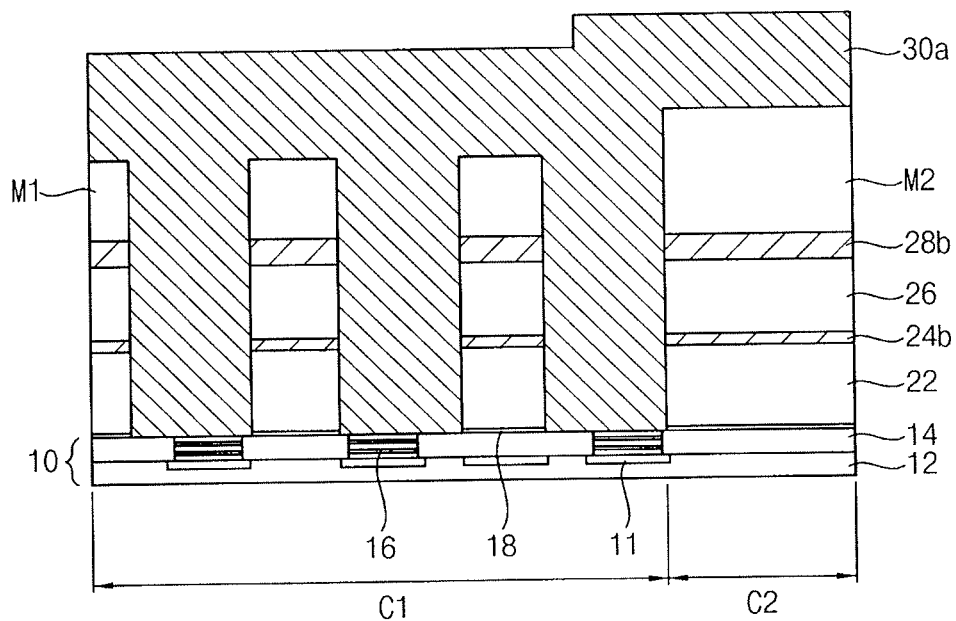

Referring to FIG. 1C, a lower electrode layer 30a may be formed on the substrate 10 to fill the contact hole H. That is, the lower electrode layer 30a may be formed to such a sufficient thickness that the contact hole H may be sufficiently filled up with the lower electrode layer 30a and, e.g., upper surfaces of, the first and the second mask patterns M1 and M2 may be covered with the lower electrode layer 30a.

For example, conductive materials may be deposited onto the substrate 10 to a sufficient thickness to fill up the contact hole H by a chemical vapor deposition (CVD) process, thereby forming the lower electrode layer 30a making contact with the interconnector 16 in the contact hole H. Examples of the conductive material for the lower electrode layer 30a may include a conductive metal nitride, e.g., titanium nitride (TiN), tantalum nitride (TaN) and tungsten nitride (WN), a metal, e.g., ruthenium (Ru), iridium (Ir), titanium (Ti) and tantalum (Ta), a conductive metal oxide, e.g., iridium oxide, etc. These may be used alone or in combinations thereof.

An aspect ratio of the contact hole H may become high due to the downsize trend and the small gap distance between the neighboring interconnectors 16. Thus, various deposition defects, e.g., void and seam defects, may occur in the lower electrode layer 30a during deposition. In such a case, the lower electrode layer 30a may be partially removed from the substrate 10 until the void and seam defects are exposed, and then the conductive materials may be deposited again to fill up the void and seam defects in the contact hole H, as will be described in detail hereinafter.

Figure 1D:
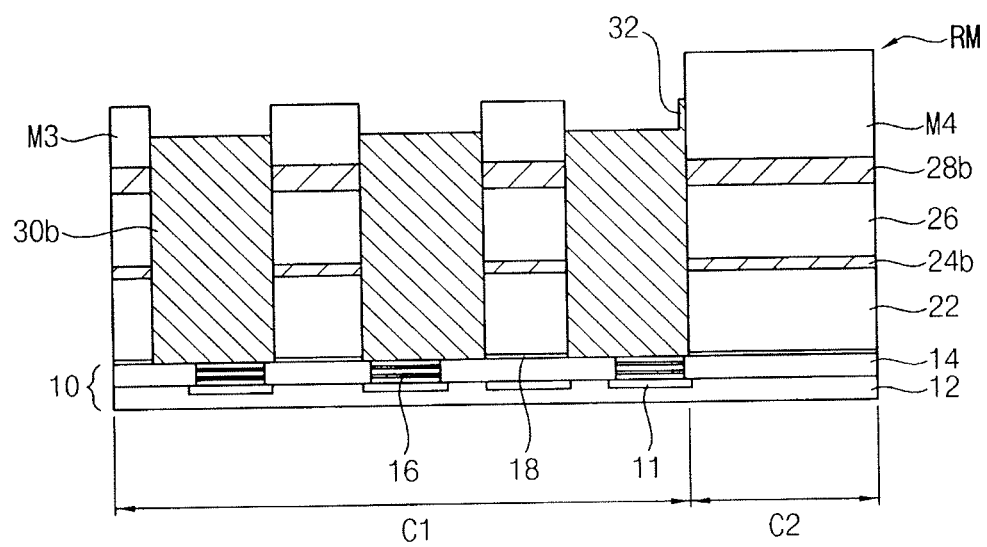

Referring to FIG. 1D, the lower electrode layer 30a may be partially removed from the substrate 10 by a node-separation etching process using the first and the second mask patterns M1 and M2 as an etching mask, thereby forming an electrode pattern 30b in the contact hole H and a residual mask RM on the second support pattern 28b in the cell area C1 and the core area C2. For example, the lower electrode layer 30a and the first and the second mask patterns M1 and M2 may be simultaneously removed from the substrate 10 by a dry etch-back process. That is, the dry etch-back process may be used as the node-separation process for separating the lower electrode layer 30a by the contact hole H.

Thus, an upper portion of the lower electrode layer 30a may be removed from the substrate 10 and the lower electrode layer 30a may be separated by the contact hole H, so that the lower electrode layer 30a may be formed into the electrode pattern 30b filling the contact hole H. In other words, a portion of the lower electrode layer 30a on the upper surfaces of the first and the second mask patterns M1 and M2 may be removed by the dry etch-back process, so remaining portions of the lower electrode layer 30a may be only within the contact hole H, e.g., so the resultant electrode patterns 30b within corresponding contact hole H may be separated from each other via the contact holes H. In addition, the first and the second mask patterns M1 and M2 may be formed into the residual mask RM on the second support pattern 28b. Particularly, the first mask pattern M1 in the cell area C1 may be formed into a first residual mask M3 and the second mask pattern M2 in the core area C2 may be formed into a second residual mask M4.

The lower electrode layer 30a may have an etch rate greater than that of the first and the second mask patterns M1 and M2 in the dry etch-back process. Thus, an upper surface of the electrode pattern 30b may be etched lower than an upper surface of the first residual mask M3 in the cell area C1.

Thus, the second support pattern 28b may be protected from the dry etch-back process by the residual mask RM, and any substantial damages to the second support pattern 28b may not occur in the dry etch-back process. Accordingly, the second support pattern 28b may not be reduced in the dry etch-back process and the thickness of the second support pattern 28b may be maintained substantially unchanged in the dry etch-back process.

Particularly, since the second residual mask M4 is formed to be thicker than the first residual mask M3, some of the lower electrode layer 30a may remain on a sidewall of the second residual mask M4 at a boundary area between the cell area C1 and the core area C2 in the dry etch-back process, thereby forming a residual electrode layer 32 on the sidewall of the second residual mask M4. The residual electrode layer 32 may extend from an outermost electrode pattern 30b at the boundary area.

If the residual mask RM were to be removed from the substrate 10 without removing the residual electrode layer 32, the residual electrode layer 32 would have protruded upward from the electrode pattern 30b and a focusing error could have occurred in a subsequent photolithography process for forming a dielectric layer on the electrode pattern 30b due to the protruding residual electrode layer 32. Thus, an additional etching process may be required for removing the residual electrode layer 32. That is, the electrode pattern 30b may be further etched in the additional etching process for removing the residual electrode layer 32.

The dry etch-back process may be controlled in such a way that the upper surface of the electrode pattern 30b may be higher than the upper surface of the second support pattern 28b, e.g., so the electrode pattern 30b may extend to cover the entirety of sidewalls of the second support pattern 28b and a lower portion of the residual mask RM after the dry etch-back process is complete. That is, the surface level of the electrode pattern 30b may be higher than the surface level of a lower electrode 30, which may be formed from the electrode pattern 30b in a subsequent process, because the electrode pattern 30b may be etched off in the additional etching process for removing the residual electrode layer 32.

Figure 1E:
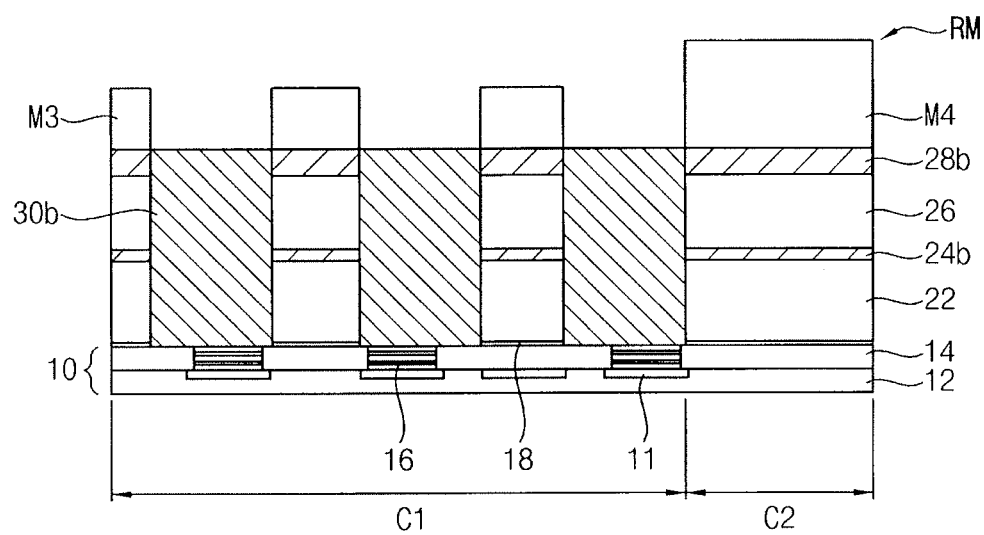

Referring to FIG. 1E, the residual electrode layer 32 may be removed from the second residual mask M4 prior to the removal of the residual mask RM.

For example, a wet etching process may be conducted on the electrode pattern 30b and the residual electrode layer 32 in such a way that the residual electrode layer 32 may be removed from the second residual mask M4. Particularly, a low peroxide sulfuric acid-hydrogen peroxide mixture (LPSPM) may be used as an etchant for the wet etching process since the residual mask RM may include polysilicon.

In the wet etching using the LPSPM as an etchant, conductive materials of the residual electrode layer 32 and the electrode pattern 30b may be removed much more than the polysilicon of the residual mask RM. Accordingly, the residual electrode layer 32 may be sufficiently removed from the sidewall of the second residual mask M4 and the thickness or the height of the electrode pattern 30b may be decreased in the wet etching process.

Particularly, the wet etching process may be controlled in such a way that the upper surface of the electrode pattern 30b may be equal to or higher than the upper surface of the second support pattern 28b, e.g., the second support pattern 28b may not be exposed to the etchant during the wet etching. When the upper surface of the electrode pattern 30b has the same level as the upper surface of the second support pattern 28b, as illustrated in FIG. 1E, the lower electrode 30 may be coplanar with the upper surface of the second support pattern 28b, which may be formed into an uppermost support, so that a surface profile of the lower electrode 30 and the uppermost support 28 may be flat or even. In contrast, if the upper surface of the electrode pattern 30b is higher than the upper surface of the second support pattern 28b, as will be explained in detail with reference to FIG. 2B below, the lower electrode 30 may protrude from the upper surface of the second support pattern 28b, so that a surface profile of the lower electrode 30 and the uppermost support 28 may be uneven. Accordingly, the contact hole H may be filled up with the electrode pattern 30b, and the second support pattern 28b may be covered with the residual mask RM without the residual electrode layer 32.

Figure 1F:
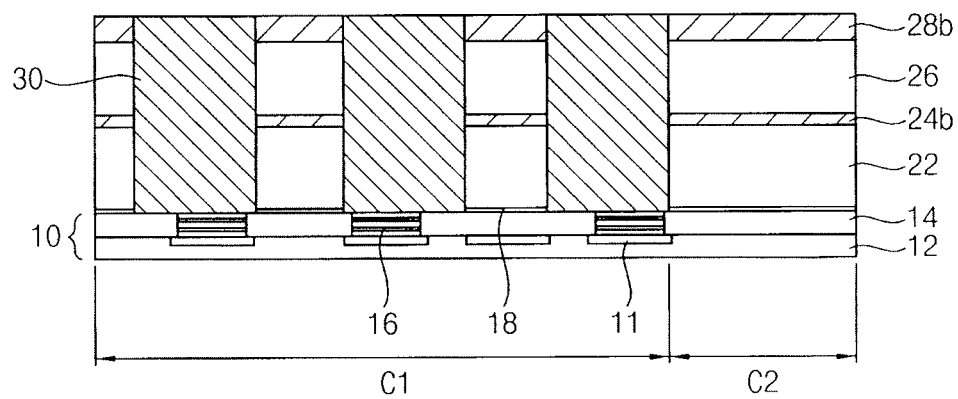

Referring to FIG. 1F, the residual mask RM may be removed from the substrate 10, thereby exposing the second support pattern 28b and forming the electrode pattern 30b into the lower electrode 30 in the contact hole H.

For example, the residual mask RM may be removed from the substrate 10 by a planarization process on condition that the second support pattern 28b may not be damaged in the planarization process. For example, a radical dry cleaning (RDC) process may be conducted on the residual mask RM using removal radicals in such a way that the polysilicon of the residual mask RM may be selectively removed with respect to the silicon nitride of the second support pattern 28b, i.e., the radicals may be selected so the polysilicon of the residual mask RM may be removed without damaging the silicon nitride of the second support pattern 28b.

For example, the substrate 10 having the residual mask RM may be loaded into a RDC chamber, and removal source gases may be transformed into source plasma including the removal radicals in the RDC chamber. Then, the removal radicals may be selectively guided to the substrate 10, and the residual mask RM may be selectively removed from the substrate 10 without any damage to the second support pattern 28b. The removal radicals may be appropriately selected in view of the compositions of the second support pattern 28b and the residual mask RM.

Accordingly, the second support pattern 28b may be exposed to surroundings along a whole surface of the substrate 10 and the electrode pattern 30b may be formed into the lower electrode 30 of which the upper surface may be coplanar with the upper surface of the second support pattern 28b. The lower electrode 30 may be arranged through the second support pattern 28b and may make contact with the interconnector 16 in the contact holes H in the cell area C1.

Particularly, the second support pattern 28b may not be damaged in the dry etch-back process, the wet etching process using the LPSPM as an etchant and the RDC process for forming the lower electrode layer 30a into the lower electrode 30, so that the height of the second support pattern 28b may be maintained unchanged in the formation of the lower electrode 30. Thus, the second support pattern 28b may have the same thickness as the second support layer 28a. In the present example embodiment, since the second support pattern 28b may be formed into the uppermost support for supporting the lower electrode 30 in a subsequent process, the height of the lower electrode 30 may be determined by the thickness of the second support pattern 28b. Therefore, the lower electrode 30 may be formed to be sufficiently high in spite of the sequential processes of dry etch-back process, the wet etching process using the LPSPM as an etchant, and the RDC process.

Figure 1G:
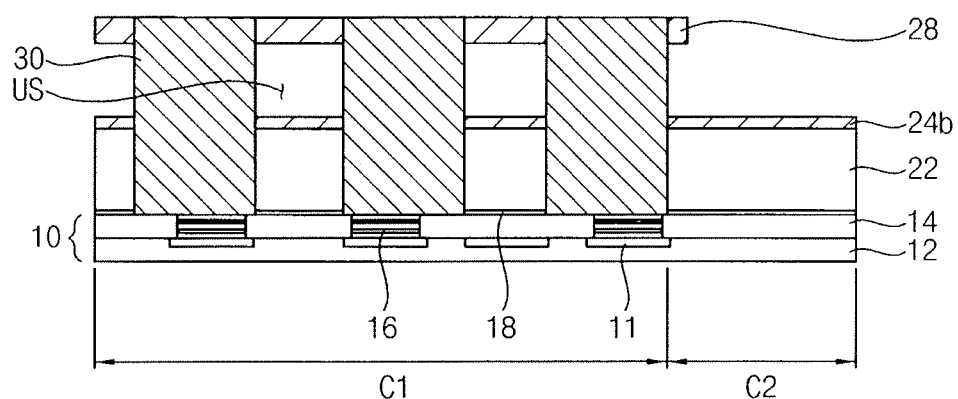

Referring to FIG. 1G, the second support pattern 28b may be partially removed from the substrate 10, thereby forming a plurality of upper openings through which the second mold pattern 26 may be exposed. Then, the second mold pattern 26 may be removed from the substrate 10 by an etching process through the upper openings.

For example, a first etching mask may be formed on the second support pattern 28b and a dry etching process may be conducted on the second support pattern 28b by using the first etching mask. Thus, the second support pattern 28b may be formed into a second support 28 having the upper openings through which the second mold pattern 26 may be exposed. For example, one such opening through the second support 28 with the second mold pattern 26 removed is illustrated in the core area C2 of FIG. 1G.

The shape of the upper opening may be changed in accordance with the configurations of the lower electrode 30. For example, the upper opening may be shaped into a circular cylinder or a rectangular pipe. Particularly, since the core area C2 may be open by the first etching mask, most of the second support pattern 28b in the core area C2 may be removed from the substrate 10 and most of the second mold pattern 26 in the core area C2 may be exposed to surroundings. Thus, a plurality of relatively small-sized upper openings may be formed in the cell area C1 and a relatively big-sized upper opening may be formed in the core area C2. A subsequent etching process may be conducted on the second mold pattern 26 through the upper openings in the cell area C1 and the core area C2.

Thus, the second support 28 may be partially cut off between a pair of the lower electrodes 30 around the upper openings and the pair of the lower electrodes 30 around the upper opening may be disconnected with and separated from each other. In contrast, the lower electrodes apart from the upper openings may be connected with each other and may be supported by the second support 28. That is, the lower electrodes 30 apart from the upper openings may be connected with one another via the second support 28, and the upper portions of the lower electrodes 30 may be supported by the second support 28.

Since the second mold pattern 26 underlying the second support 28 may be removed from the substrate 10 in a subsequent etching process, the lower electrodes 30 may be supported only by the second support 28. Thus, the number and the configurations of the second support 28 may be varied according to the support forces that may be required for sufficiently supporting the lower electrodes 30.

Then, a wet etching process may be conducted on the second mold pattern 26 through the upper openings, thereby removing the second mold pattern 26 from the substrate 10. Since the lower electrodes 30 may be sufficiently supported by the second support 28, the lower electrodes 30 may be prevented from leaning in spite of the removal of the second mold pattern 26. That is, the lower electrodes 30 may still remain perpendicular with respect to the substrate 10 by the second support 28 although the second mold pattern 26 may be removed from the substrate 10.

In the present example embodiment, since the second mold pattern 26 may include an oxide, the wet etching process for removing the second mold pattern 26 may be conducted by using a limulus amoebocyte lysate (LAL) aqueous solution as an etchant. The LAL aqueous solution may be a mixture of hydrogen fluoride (HF), ammonium fluoride ($NH_4F$) and de-ionized water.

Thus, a top portion of the lower electrode 30 may be supported by the second support 28 and a lower portion of the lower electrode 30 may be supported by the first support pattern 24b and the first mold pattern 22, and an upper space US may be provided between the first support pattern 24b and the second support 28. Accordingly, an upper side of the lower electrode 30 may be exposed to the upper space US and the upper surface of the lower electrode 30 may be coplanar with the upper surface of the second support 28.

Figure 1H:
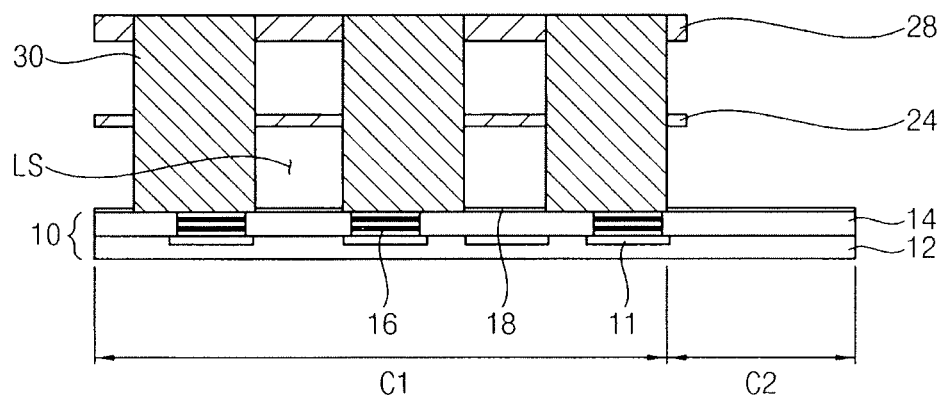

Referring to FIG. 1H, the first support pattern 24b may be partially removed from the substrate 10, thereby forming a plurality of lower openings through which the first mold pattern 22 may be exposed. Then, the first mold pattern 22 may be removed from the substrate 10 by an etching process through the lower openings.

For example, a second etching mask may be formed on the second support 28 and the lower electrode 30 in such a way that the upper portions may be communicated with the second etching mask and thus the first support pattern 24b may be exposed through the upper openings and the second etching mask. A wet etching process may be conducted on the first support pattern 24b by using the second etching mask, thereby forming the lower openings through which the first mold pattern 22 may be exposed. Particularly, the second etching mask may be formed just in the cell area C1 and most of the core area C2 may be exposed like the first etching mask. Thus, the first support pattern 24b may be formed into a first support 24 having the lower openings in the cell area C1 and most of the first support pattern 24b may be removed from the core area C2. In the same way as the second mold pattern 26, the first mold pattern 22 may be removed from the substrate 10 by the wet etching process using the LAL aqueous solution as an etchant.

Accordingly, the first support 24 may be spaced apart from the etch stopper 18 and a lower space LS may be provided between the first support 24 and the etch stopper 18. The lower electrodes 30 apart from the lower openings may be connected with each other via the first support 24 at a middle sidewall, so that the middle portions of the lower electrodes 30 may be supported by the first support 24. That is, the upper portion of the lower electrodes 30 may be supported by the second support 28 and the middle portion of the lower electrodes 30 may be supported by the first support 24. Thus, the lower electrodes 30 may be prevented from leaning in spite of the removal of the first and the second mold patterns 22 and 26.

In addition, a lower side of the lower electrode 30 may be exposed to the lower space LS in the same way as the side of the lower electrode 30 may be exposed to the upper space US.

Therefore, a plurality of cylindrical lower electrodes 30 may be arranged on the substrate 10 in the matrix shape and each of the cylindrical lower electrodes 30 may be supported by the first and the second supports 24 and 28 at the top portion and the middle portion. Thus, the lower electrode 30 may sufficiently prevented from leaning in spite of the high aspect ratio of the cylindrical shape. The upper space US and the lower space SL may be communicated with surroundings through the upper and lower openings.

Figure 1I:
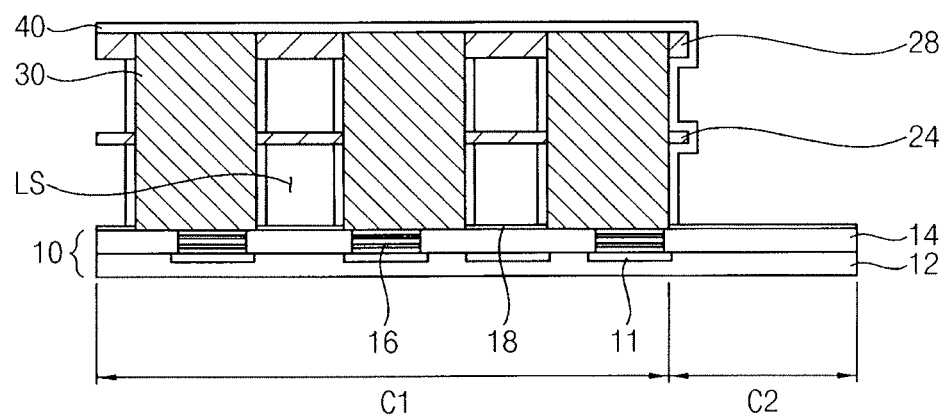

Referring to FIG. 1I, a dielectric layer 40 may be formed along surfaces of the lower electrodes 30. In the present example embodiment, the dielectric layer 40 may be formed on the top surfaces of the lower electrodes 30 and the second supports 28 and side surfaces of the lower electrodes 30 that may be exposed to the upper space US and the lower space LS.

Dielectric materials may be supplied into the upper and lower spaces US and LS through the upper and lower openings and then may be deposited onto the top surfaces of the lower electrodes 30 and the second supports 28 as well as onto the side surfaces of the lower electrodes 30, thereby forming the dielectric layer 40 on the top surfaces and side surfaces of the lower electrodes 30 and on the top surfaces of the second supports 28. The dielectric layer 40 may include any one material of, e.g., an oxide, a nitride and an oxynitride.

Particularly, the dielectric layer 40 may be formed only in the cell area C1 and no dielectric layer may be formed in the core area C2. Thus, the etch stopper 18 may be exposed to surroundings in the core area C2.

Figure 1J:
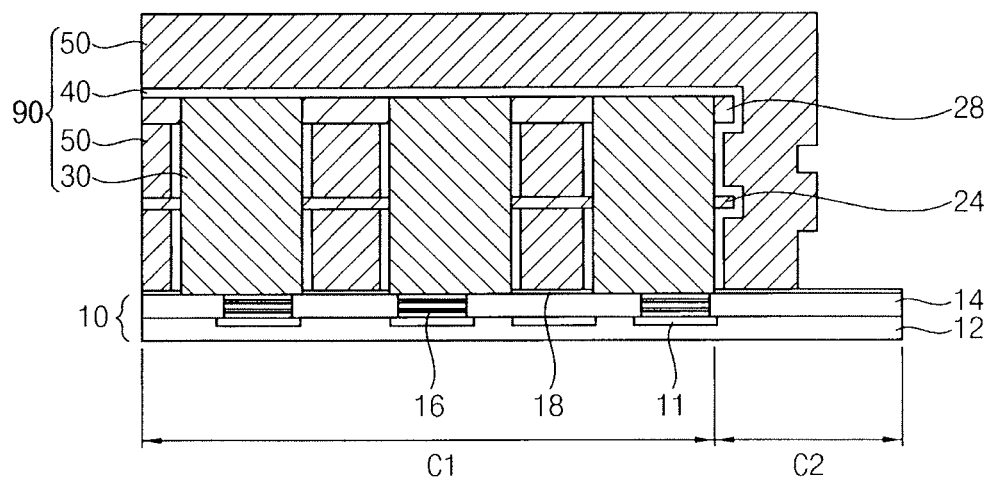

Referring to FIG. 1J, an upper electrode layer 50 may be formed on the dielectric layer 40.

For example, conductive materials may be deposited onto the dielectric layer 40 by a deposition process such as a CVD process. The conductive materials may also be supplied into the upper and the lower spaces US and LS through the upper and the lower openings and through the open core area C2 in the deposition process.

Thus, the conductive layer may be formed on the dielectric layer 40 to a uniform thickness together with filling up the upper and the lower spaces US and LS, thereby forming the upper electrode 50. In the present example embodiment, the upper electrode 50 may be the same conductive materials as the lower electrode 30.

In such a case, the lower electrode 30 and the upper electrode 50 may face each other in a medium of the dielectric layer 40 at the top surface and the side surface of the lower electrode 30, so a capacitor 90 may be individually provided at the top surface and the side surface of the lower electrode 30.

Since the second supports 28 may be formed from the second support layer 28a without any substantial height reduction and the top surfaces of the lower electrodes 30 may be coplanar with the top surfaces of the second supports 28, the lower electrodes 30 may be formed to be as high as possible. Thus, the upper and the lower spaces US and LS may also be formed to be as high as possible, and as a result, the size of the facing surfaces between the upper electrodes 50 and the lower electrodes 30 may increase in the upper and lower spaces US and LS. Accordingly, the capacitance of the capacitor 90 may increase in proportional to the height of the lower electrode 30.

According to the example embodiments of the method of forming the capacitor 90 of the semiconductor device, the second support pattern 28b may have sufficient etch selectivity with respect to the conductive materials and the polysilicon in the etch-back process and the wet etching process for forming the lower electrodes 30, and the RDC process for removing the mask pattern M, so no substantial damage to the second support pattern 28b may occur in the etch-back process, the wet etching process, and the RDC process. Therefore, the thickness of the second support layer 28a may be maintained unchanged in the etch-back process, the wet etching process, and the RDC process, so the height of the second support layer 28a may be as high as possible. Since the height of the lower electrode 30 may be varied according to the height of an uppermost support, the height of the lower electrode 30 may be formed to be as high as possible, thereby increasing the capacitance of the capacitor 90.

According to a typical process for forming a lower electrode, i.e., when a height of a second support layer is not maintained unchanged, an uppermost support layer may be partially removed by an etch-back process during formation of a contact hole and by a node-separation process during formation of a lower electrode in the contact hole, so that the thickness of the uppermost support may be reduced. In contrast, according to the present example embodiment, the node-separation process for forming the lower electrode 30 may be conducted in such a condition that the second support pattern 28b may be covered with the residual mask RM, so that the second support pattern 28b may be sufficiently protected from the node-separation process. Thus, the thickness of the second support pattern 28b may be maintained unchanged in spite of the node-separation process. In addition, the residual mask RM may be removed from the uppermost support pattern 28b by the RDC process without any damages to the second support pattern 28b, so that the second support pattern 28b may also be protected from the RDC process. Thus, the thickness of the second support pattern 28b may be still maintained unchanged in spite of the RDC process.

The height of the lower electrode 30 may be determined by the height of the uppermost support since the uppermost support may support the top portion of the lower electrode 30. Thus, since no thickness reduction of the second support pattern 28b occurs in example embodiments, e.g., the thickness of the second support pattern 28b is maintained constant until the residual mask is removed, no height reduction of the lower electrode 30 may occur, e.g., the lower electrode 30 may have a maximal height. Accordingly, the capacitance of the capacitor 90 having the lower electrode 30 may be maximized in the semiconductor device.

While the present example embodiment discloses that the upper surface of the lower electrode 30 may be coplanar with the upper surface of the uppermost support 28, the lower electrode 30 may also protrude above the uppermost support 28 to a protrusion height just by controlling an etch rate of the lower electrode layer 30a, thereby increasing the height of the lower electrode 30 as long as the protrusion height.

Figure 2A:
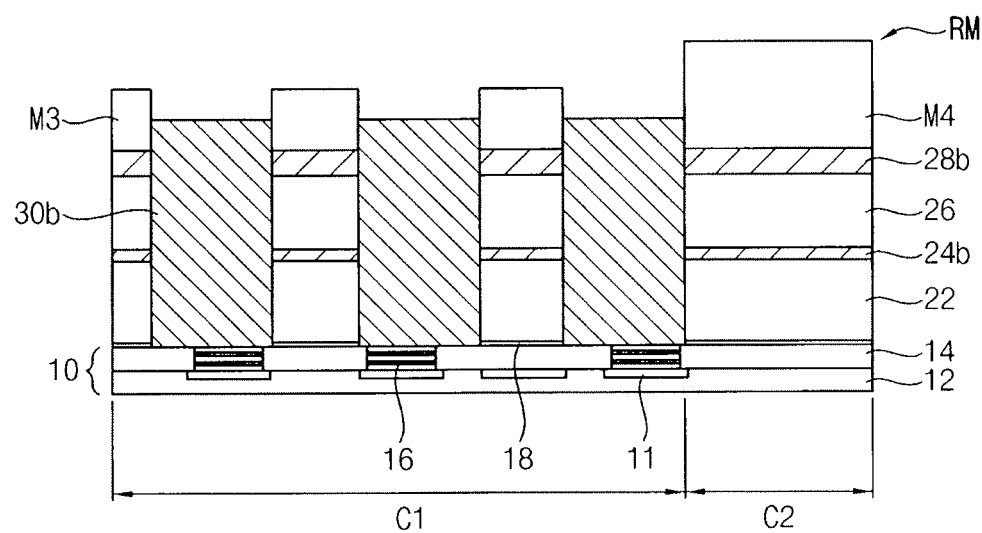
FIGS. 2A to 2C illustrate cross-sectional views of stages in a modified method of forming the capacitor in accordance with embodiments.
Figure 2B:
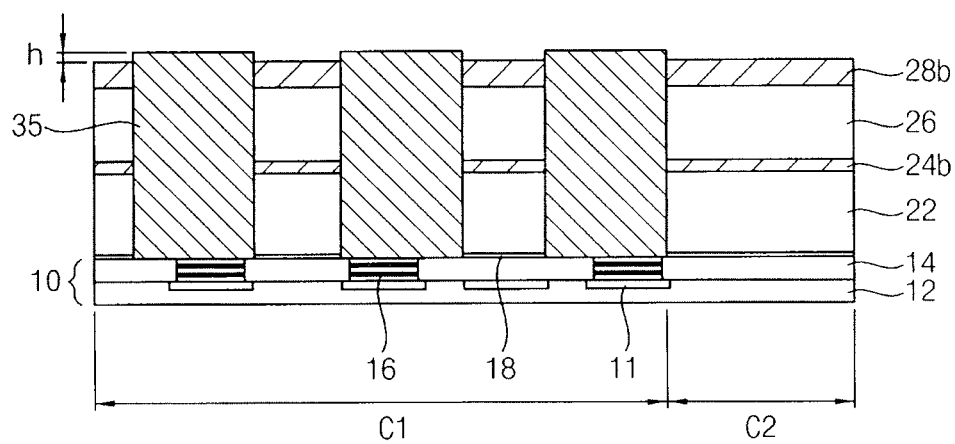
Figure 2C:
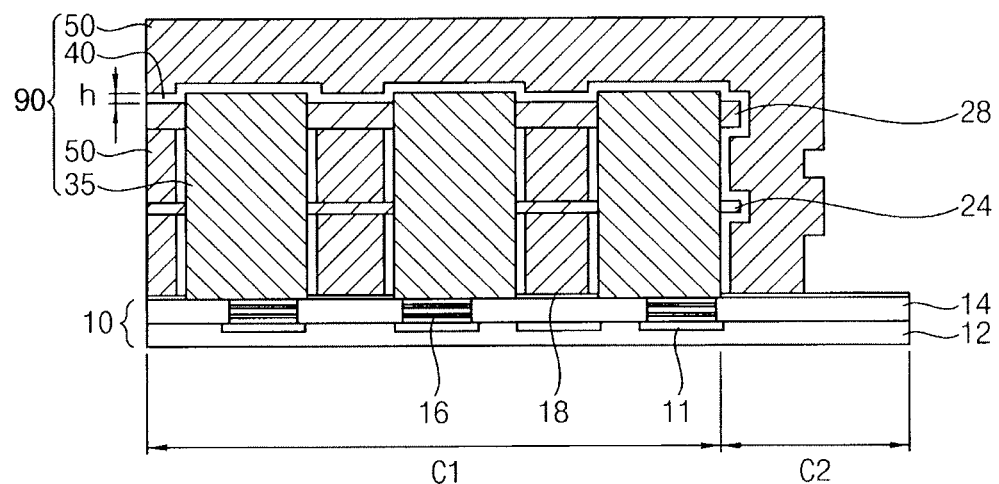

FIGS. 2A to 2C are cross-sectional views illustrating stages in a modified method of forming the capacitor in accordance with the first example embodiment.

Referring to FIG. 2A, the lower electrode layer 30a may be formed into the electrode pattern 30b by the dry etch-back process, and the residual electrode layer 32 may be removed from the second residual mask M4 by a wet etching process using the LPSPM as an etchant by the same processes as described in detail with reference to FIGS. 1A to 1E. Particularly, the dry etch-back process may be controlled in such a way that the upper surface of the electrode pattern 30b may be higher than the upper surface of the second support pattern 28b. Therefore, the contact hole H may be filled up with the electrode pattern 30b of which the upper surface may be higher than the upper surface of the second support pattern 28b and the electrode pattern 30b may be defined by the first residual mask M3 in the cell area C2.

Referring to FIG. 2B, the residual mask RM may be removed from the second support pattern 28b in the same RDC process as described in detail with reference to FIG. 1F, and the electrode pattern 30b may be formed into the protruded lower electrode 35 that may be protrude from, e.g., above, the second support pattern 28b to a protrusion height h. Thus, the height of the second support pattern 28b may be maintained unchanged in the RDC process and the second support pattern 28b may also have the same thickness as the second support layer 28a. Accordingly, the second support pattern 28b and the protruded lower electrode 35 may be arranged in the cell area C1 and the second support pattern 28b may be arranged in the core area C2. Thus, the surface profile of the cell area C1 may be uneven and the surface profile of the core area C2 may be even, e.g., may be flat.

The protrusion height h may be controlled in view of device requirements and process conditions. Particularly, the protrusion height h may be formed to be as high as possible as long as the focusing margin of the subsequent photolithography process may not be deteriorated. The height of the lower electrode 30 may increase as much as the protrusion height h, thereby increasing the capacitance of the capacitor 90.

Referring to FIG. 2C, the dielectric layer 40 may be formed on the top and side surfaces of the protruded lower electrodes 35 and the top surfaces of the second support 28, and the upper electrode 50 may be formed on the dielectric layer 40 and in the upper and lower surfaces US and LS in such a way that the upper and the lower spaces US and LS may be filled up with the upper electrode 50 in the same processes as described in detail with reference to FIGS. 1G to 1J. Thus, the capacitance of the capacitor 90 having the protruded lower electrode 35, the dielectric layer 40 and the upper electrode 50 may increase due to the protrusion height h of the protruded lower electrode 35.

FIGS. 3A to 3D illustrate cross-sectional views of stages in another modified method of forming the capacitor in accordance with the first example embodiment.

Figure 3A:
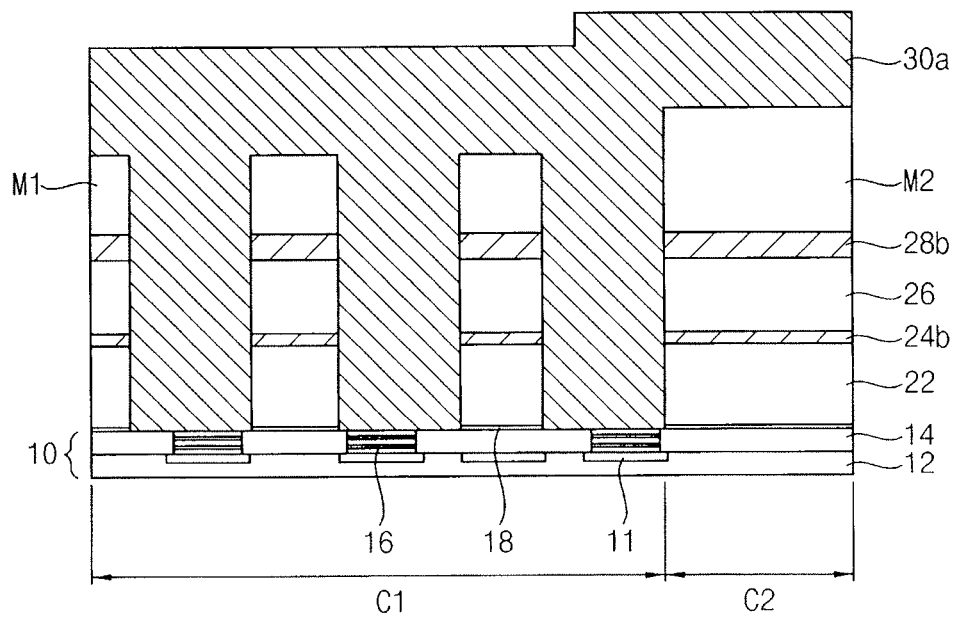
FIGS. 3A to 3D illustrate cross-sectional views of stages in another modified method of forming the capacitor in accordance with embodiments.

Referring to FIG. 3A, a lower electrode layer 30a may be formed on the whole surface of the substrate 10 in the same processes as described in detail with reference to FIGS. 1A to 1C in such a way that the mask pattern M may be covered with the lower electrode layer 30a. The mask pattern M may include a first mask pattern M1 in the cell area C1 of the substrate 10 and a second mask pattern M2 in the core area C2 of the substrate 10.

Figure 3B:
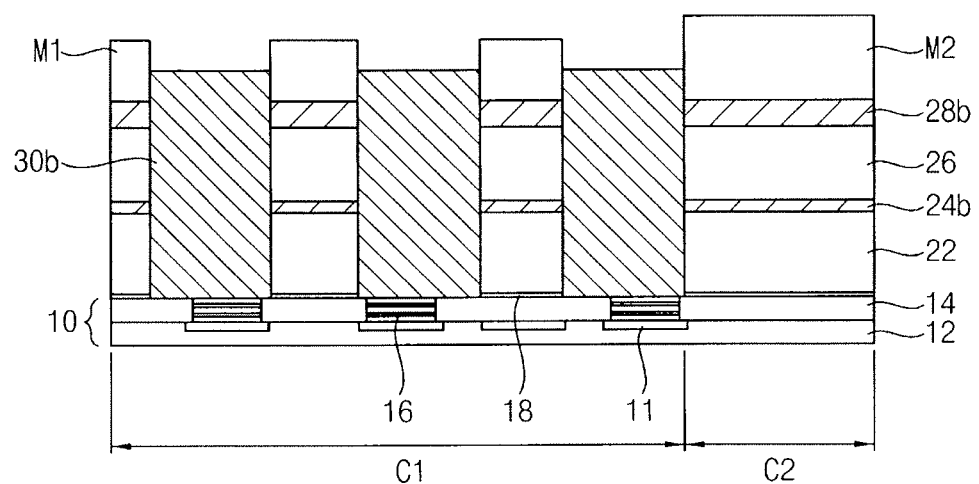

Referring to FIG. 3B, the lower electrode layer 30a may be partially removed from the substrate 10 in such a way that the first mask pattern M1 around the contact hole H and the second mask pattern M2 and covering the core area C2 of the substrate 10 may be exposed. Thus, the lower electrode layer may be formed into an electrode pattern 30b that may be separated by a contact hole H.

Particularly, the lower electrode layer 30a may be removed to such an amount that the mask pattern M may be exposed, so the electrode pattern 30b may be sufficiently higher than the second support pattern 28b. That is, the electrode pattern 30b may fill up the contact hole H in the cell area C1 and may be higher than the second support pattern 28b, while the first mask pattern M1 enclosing the electrode pattern 30b and the second mask pattern M2 covering the core area C2 may be exposed. The electrode pattern 30 may be lower than the mask pattern M.

Various etching process may be performed to the lower electrode layer 30a as long as the mask pattern M may be exposed. Thus, any etching processes for etching conductive materials may be allowable for the removal of the lower electrode layer 30a as long as the mask pattern may be exposed without substantial losses of the mask pattern M.

For example, a wet etching process using LPSPM as an etchant may be conducted on the lower electrode layer 30a in such a way that the lower electrode layer 30a may be selectively removed from the mask pattern M without any substantial removal of the mask pattern M. Thus, the mask pattern M may have the same thickness in spite of the wet etching process using the LPSPM as an etchant.

In contrast, a dry etch back process may be firstly conducted on the lower electrode layer 30a until the mask pattern M may be exposed and then the wet etch process using the LPSPM as an etchant may be secondly conducted on the lower electrode layer 30a until the lower electrode layer 30a may be sufficiently separated by a contact hole H and be formed into the electrode pattern 30b. In such a case, the mask pattern M may be partially removed by the dry etch back process and may be formed into the residual mask RM that may be substantially the same configurations as described in detail with reference to FIG. 2A.

Although the lower electrode layer 30a may be removed by the dry etch back process, the second support pattern 28b may be sufficiently protected in the dry etch back process by the residual mask RM. Thus, the node-separation of the lower electrode layer 30a without any substantial losses of the mask pattern M may be performed with high efficiency by the sequential performance of the dry etch back process and the wet etching process using the LPSPM as an etchant.

Figure 3C:
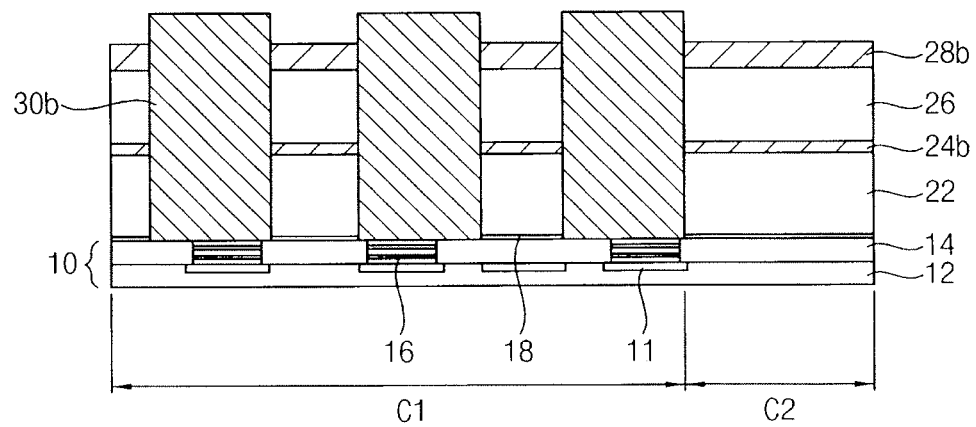

Referring to FIG. 3C, the mask pattern M may be removed from the second support pattern 28b and thus the second support pattern 28b may be exposed.

For example, a radical dry cleaning (RDC) process may be conducted on the mask pattern M using removal radicals in such a way that the mask pattern M may be selectively removed with respect to the second support pattern 28b. In the present example embodiment, the mask pattern M may include polysilicon and the second support pattern 28b may include silicon nitride, so that the radicals by which only the polysilicon of the mask pattern M may be removed without any losses of the silicon nitride of the second support pattern 28b. The RDC process may be substantially the same process as described in detail with reference to FIG. 1F, so any further detailed descriptions on the RDC process will be omitted. Thus, the height of the second support pattern 28b may be maintained unchanged in the RDC process and the second support pattern 28b may also have the same thickness as the second support layer 28a.

Figure 3D:
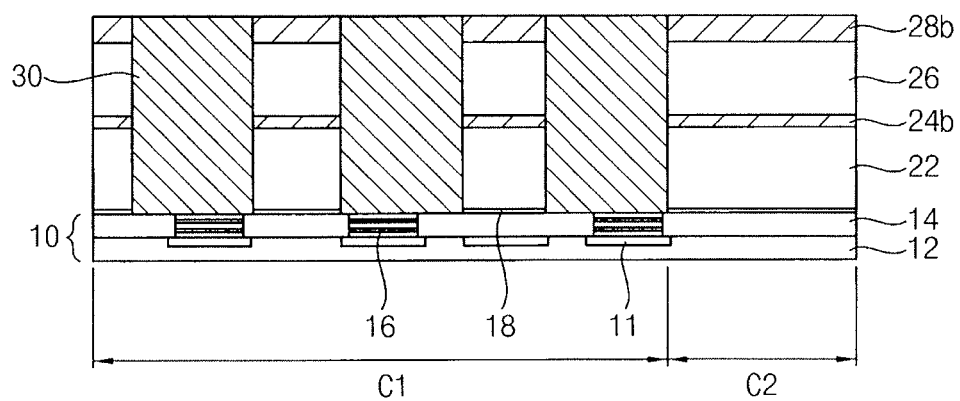

Referring to FIG. 3D, the electrode pattern 30b may be planarized to be substantially coplanar with the support pattern 28b which may have substantially the same thickness as the support layer 26a, thereby forming a lower electrode 30 in the contact hole H.

For example, a chemical mechanical polishing may be conducted to the electrode pattern 30b by using slurries having sufficiently low polishing characteristics to the second support pattern 28b and sufficiently high polishing characteristics to the electrode pattern 30b. However, an etch back process may also be utilized for removing an upper portion of the electrode pattern 30b as long as the second support pattern 30b may be sufficiently resistive to the etch back process.

According to a typical CMP process for forming the lower electrode, the lower electrode layer was formed on the second support pattern 28b and thus the second support pattern 28b was necessarily damaged in the CMP process. However, since the electrode pattern 30b of the present example embodiment may be sufficiently higher than the second support pattern 28b, proper polishing conditions and slurries of the CMP may enable the electrode pattern 30b to be coplanar with the second support pattern 28b without any substantial losses or damages to the second support pattern 28b. Accordingly, the lower electrode 30 may be coplanar with the second support pattern 28b and the second support pattern 28bm may have substantially the same thickness as the second support layer 28a because any substantial losses or damages may not occur to the second support pattern 28b in the CMP process for forming the lower electrode 30.

Thereafter, the dielectric layer 40 and the upper electrode 50 may be formed by the same processes as described in detail with reference to FIGS. 1G to 1J, thereby forming the capacitor 90 on the substrate 10.

When the lower electrode layer 30a may be formed into the lower electrode 30 by the etching process, the second support pattern 28b may be sufficiently protected from the etching process by the mask pattern M. That is, the lower electrode 30 may be formed in the contact hole H without any damages to an uppermost support pattern, so that the lower electrode 30 may be formed to be as high as possible corresponding to the uppermost support pattern of which the thickness or the height may not be reduced in the formation of the lower electrode 30. Accordingly, the capacitor 90 may have a sufficient capacitance in spite of the size reduction of the semiconductor memory devices.

The above processes for forming the capacitor may be modified so as to eliminate the void or the seam defects in the lower electrode 30. Since the aspect ratio of the contact hole H tends to increase due to the reduction of the gap distance between the neighboring interconnectors 16 and the thickness of the mask pattern M, void defects or seam defects may occur in the lower electrode layer 30a. Thus, the above process for forming the capacitor may be modified so as to eliminate the void defects and/or the seam defects, as will be described below with reference to FIGS. 4A-4F.

FIGS. 4A to 4F are cross-sectional views illustrating stages in still another modified method of forming the capacitor in accordance with the first example embodiment.

Figure 4A:
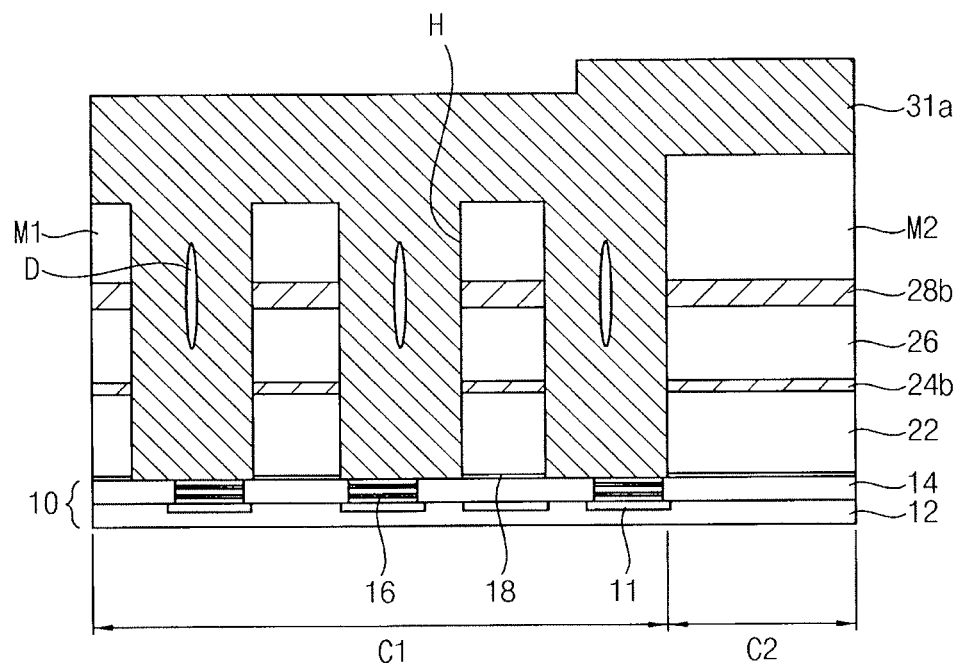
FIGS. 4A to 4F illustrate cross-sectional views of stages in still another modified method of forming the capacitor in accordance with embodiments.

Referring to FIG. 4A, a lower electrode layer 31a may be formed on the whole surface of the substrate 10 in the same processes as described in detail with reference to FIGS. 1A to 1C. Particularly, various deposition defects may occur in the lower electrode layer 31a due to the high aspect ratio of the contact hole H. For example, void defects may occur in the lower electrode layer 31a due to the overhanging of the lower electrode layer at an upper portion of the contact hole H. In addition, when the lower electrode layer 31a is insufficiently formed at boundary areas between the contact hole H and the mask pattern M and between the contact hole H and the first and the second mold patterns 22 and 26, a minute stripe-shaped empty space may occur at the boundary areas, thereby forming seam defects in the lower electrode layer 31a.

Figure 4B:
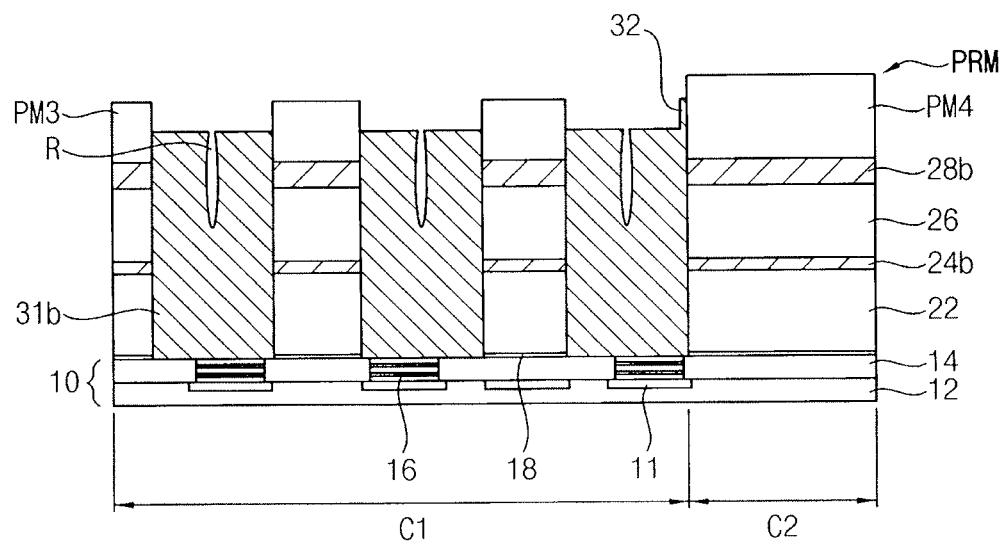

Referring to FIG. 4B, if any deposition defects occur, the lower electrode layer 31a may be partially removed from the substrate 10 by an etching process using the first and the second mask patterns M1 and M2 as an etching mask, thereby forming a first electrode pattern 31b that may be separated by the contact hole H and a preliminary residual mask PRM covering the second support pattern 28b. For example, the dry etch-back process described in detail with reference to FIG. 1D may be conducted in such a way that the lower electrode layer 31a and the mask pattern M may be removed until the deposition defects D may be exposed.

Thus, the first electrode pattern 31b may be formed in the contact hole H and may be defined by the preliminary residual mask PRM and the deposition defects D may be exposed at an upper portion. The first mask pattern M1 may be formed into a first preliminary residual mask PM3 in the cell area C1, and the second mask pattern M2 may be formed into a second preliminary residual mask PM2 in the core area C2. The preliminary residual mask PRM may include the first preliminary residual mask PM3 and the second preliminary residual mask PM4, and may have a thickness smaller than the mask pattern M.

Since the mask pattern M may function as an etching mask for the dry etch-back process, the second support pattern 28b may be sufficiently protected from the dry etch-back process by the preliminary residual mask PRM and an upper surface of the first electrode pattern 31b may be lower than an upper surface of the preliminary residual mask PRM. In addition, the residual electrode layer 32 may also be formed on a sidewall of the second preliminary residual mask PM4 at the boundary area between the cell area C1 and the core area C2, as describe in detail with reference to FIG. 1D. Particularly, the empty space of the deposition defects D may be formed into a recess R of the first electrode pattern 31b that may be recessed from the top surface of the first electrode pattern 31b.

Figure 4C:
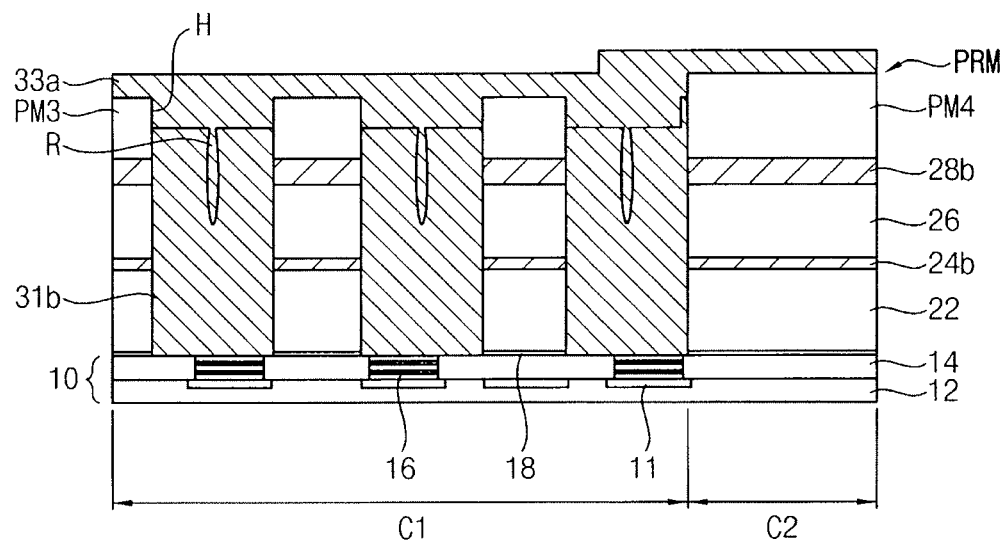

Referring to FIG. 4C, an additional conductive layer 33a may be formed on the first electrode pattern 31b and on the preliminary residual mask PRM to a sufficient thickness for filling up the recess R of the first electrode pattern 31b. For example, the additional conductive layer 33a may include the same conductive materials as the lower electrode layer 31a and may be formed by the same deposition process as the lower electrode layer 31a.

Thus, the additional conductive layer 33a may formed along a surface profile of the first electrode pattern 31b having the recess and defined by the preliminary residual mask PRM, and thus the first electrode pattern 31b and the preliminary residual mask PRM may be fully covered by the additional conductive layer 33a.

Figure 4D:
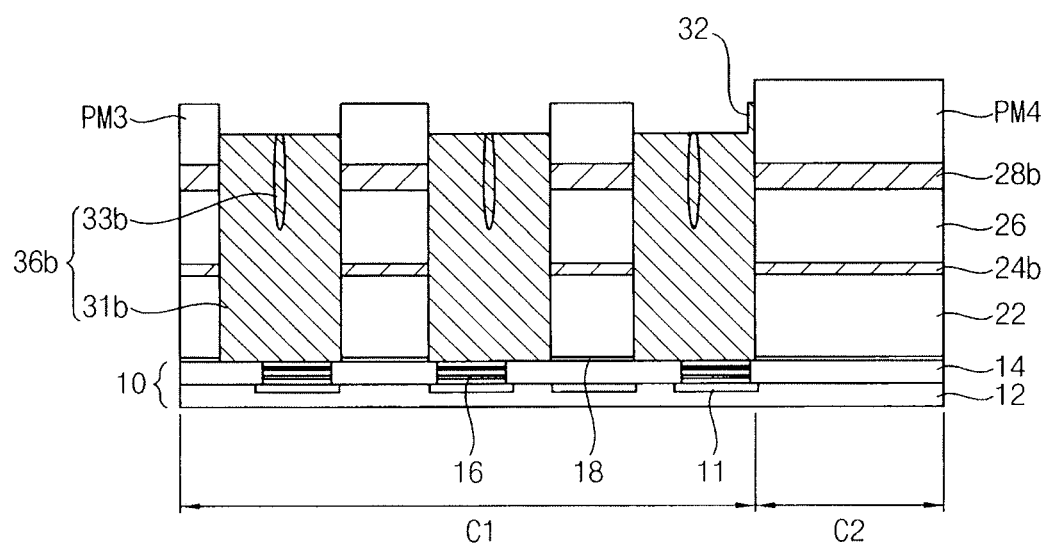

Referring to FIG. 4D, the dry etch-back process may be conducted on the additional conductive layer 33a and the preliminary residual mask PRM until the upper surface of the first electrode pattern 31b may be exposed. Thus, the additional conductive layer 33a may be formed into a second electrode pattern 33b filling up the recess R and the preliminary residual mask PRM may be reduced a little bit. Accordingly, the first electrode pattern 31b and the second electrode pattern 33b may be formed into the electrode pattern 36b filling the contact hole H.

For example, the additional conductive layer 33a and the preliminary residual mask PRM may be simultaneously removed from the substrate 10 by the dry etch-back process. Thus, the additional conductive layer 33a may be separated by the contact hole H and may be formed to the second electrode pattern 33b that may fill the contact hole H defined by the preliminary residual mask PRM. Thus, the recess R of the first electrode pattern 31b may be filled with the second electrode pattern 33b.

In the present example embodiment, the lower electrode layer 31a and the mask pattern M may be partially removed from the substrate 10 by a first dry etch-back process and the additional conductive layer 33a, and the preliminary residual mask PRM may be partially removed from the substrate 10 by a second dry etch-back process, so that the first electrode pattern 31b may be formed by the first dry etch-back process and the second electrode pattern 33b may be formed by the second dry etch-back process.

Particularly, the second support pattern 28b may be protected from the first dry etch-back process by the mask pattern M and may also be protected from the second dry etch-back process by the preliminary residual mask PRM. Thus, the second support pattern 28b may not be damaged in the first and the second dry etch-back processes and the thickness reduction of the second support pattern 28b may be sufficiently prevented in the first and the second dry etch-back processes.

Particularly, since the second preliminary residual mask PM4 may be formed to be thicker than the first preliminary residual mask PM3, some of the additional conductive layer 33a may remain on a sidewall of the second preliminary residual mask PM4 at the boundary area between the cell area C1 and the core area C2 in the second dry etch-back process, so that some of the additional conductive layer 33a may remain on the sidewall of the second preliminary residual mask PM4 and the residual electrode layer 32 may be further grown by the additional conductive layer 33a at the boundary area. In such a case, the second dry etch-back process may be controlled in such a way that the upper surface of the electrode pattern 36b may be higher than the upper surface of the second support pattern 28b in view of further removal in a subsequent etching process for removing the residual electrode layer 32. Thus, the upper surface of the second electrode pattern 33b may be equal to or higher than the upper surface of the first electrode pattern 31b according to the amount of the further removal of the electrode pattern 36b.

While the present example embodiment discloses that the formation of the additional conductive layer and the additional dry etch-back process against the additional conductive layer may be sequentially conducted for removing the deposition defects D of the lower electrode layer 31a, further formation of another additional conductive layer and further dry etch-back process against the another additional conductive layer may be repeated for removing the deposition defects D according to the configurations and distributions of the deposition defects D in the lower electrode layer 31a.

As the repetition number of the further formation of another additional conductive layer and the further dry etch-back against another additional conductive layer may increase, a component layer of the electrode pattern 36b may also be added in the contact hole H. Thus, while the present example embodiment discloses that the electrode pattern 36b may include the first electrode pattern 31b and the second electrode pattern 33b, third or more electrode pattern may also be included in the electrode pattern 36b.

Figure 4E:
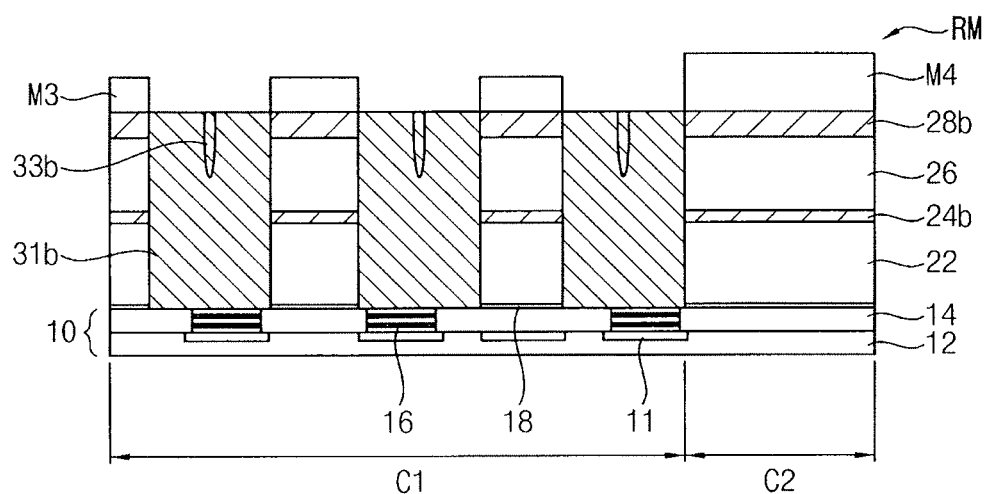

Referring to FIG. 4E, the residual electrode layer 32 may be removed from the second preliminary residual mask PM4 by substantially the same processes as described with reference to FIG. 1E. For example, the wet etching process may be conducted on the electrode pattern 36b and the residual electrode layer 32 in such a way that the residual electrode layer 32 may be selectively removed from the second preliminary residual mask PM4. Particularly, the LPSPM may be used as an etchant for the wet etching process since the residual mask RM may include polysilicon. That is, the residual electrode layer 32 may be removed from the substrate 10 together with a top portion of the electrode pattern 36b by a selective etch against the conductive materials with respect to the polysilicon.

Since the top portion of the electrode pattern 36b may also be removed from the substrate 10 in the wet etching process, the thickness or the height of the electrode pattern 36b may be slightly decreased due to the wet etching process. In addition, the top portion of the preliminary residual mask PRM may be removed from the substrate 10 in the wet etching process, and the thickness or the height of the preliminary residual mask PRM may be slightly decreased, thereby forming the residual mask RM.

In the present example embodiment, the wet etching process may be controlled in such a way that the upper surface of the electrode pattern 36b may be equal to or higher than the upper surface of the second support pattern 28b. When the upper surface of the electrode pattern 36b has the same level as the upper surface of the second support pattern 28b, the lower electrode 36 may be coplanar with the upper surface of the second support pattern 28b, which may be formed into an uppermost support in the present example embodiment, so that a surface profile of the lower electrode 30 and the uppermost support 28 may be flat or even.

In contrast, when the upper surface of the electrode pattern 36b is higher than the upper surface of the second support pattern 28b, the lower electrode 36 may protrude from the upper surface of the second support pattern 28b, which may be an uppermost support in the present example embodiment, so that a surface profile of the lower electrode 36 and the uppermost support pattern 28b may be uneven, as is illustrated in FIGS. 2A to 2C.

Accordingly, the contact hole H may be filled up with the electrode pattern 36b and the second support pattern 28b may be covered with the residual mask RM. The second support pattern 28b in the cell area C1 may be covered with the first residual mask M3 and the second support pattern 28b in the core area C2 may be covered with the second residual mask M4.

Figure 4F:
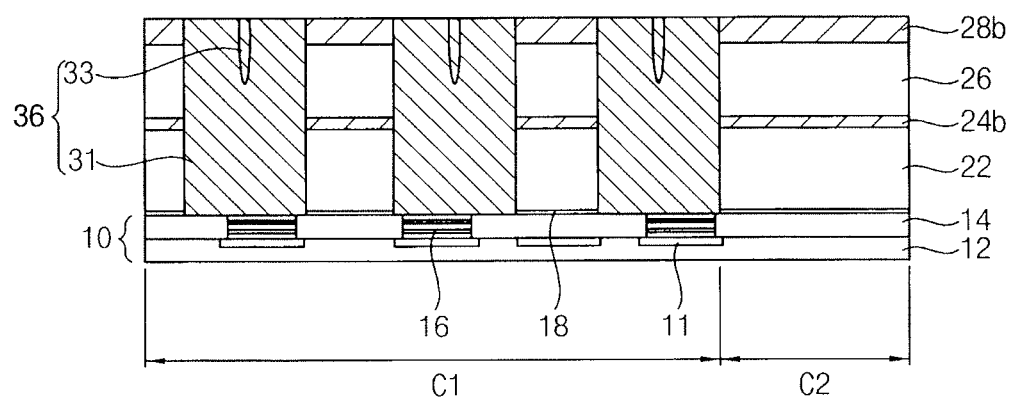

Referring to FIG. 4F, the residual mask RM may be removed from the substrate 10, thereby exposing the second support pattern 28b and forming the electrode pattern 36b into the lower electrode 36 in the contact hole H.

The residual mask RM may be removed from the substrate 10 by a planarization process on condition that the second support pattern 28b may not be damaged in the planarization process as described in detail with reference to FIG. 1F. For example, the RDC process may be conducted on the residual mask RM using removal radicals in such a way that the polysilicon of the residual mask RM may be selectively removed with respect to the silicon nitride of the second support pattern 28b.

Accordingly, the second support pattern 28b may be exposed to surroundings along a whole surface of the substrate 10 and the lower electrode 36 may be arranged through the second support pattern 28b in the cell area C1. The lower electrode 36 may make contact with the interconnector 16 in the contact holes H.

Particularly, no substantial damages to the second support pattern 28b may occur when the lower electrode layer 31a and the additional conductive layer 33a may be formed to the lower electrode 36, so that the height of the second support pattern 28b may be unchanged during the formation of the lower electrode 36. Thus, the second support pattern 28b may also have the same thickness as the second support layer 28a.

In addition, since the deposition defect D in the lower electrode layer 31a may be sufficiently removed by the additional conductive layer 33a, the lower electrode 36 may have no deposition defects and the operation reliability of the capacitor 90 having the lower electrode 36 may be improved.

Particularly, since the thickness or the height of the second support pattern 28b may not be reduced in spite of the repeated etch-back process, the wet etching process using the LPSPM as an etchant and the RDC process, the thickness or the height of the lower electrode 36 may be maximized in the cell area C1.

Thereafter, the dielectric layer 40 and the upper electrode 50 may be formed by the same processes as described in detail with reference to FIGS. 1G to 1J, thereby forming the capacitor 90 on the substrate 10. The deposition defects of the lower electrode 36 may be eliminated by repeating the deposition of the conductive layer and the dry etch-back process to the conductive layer without any damages to the second support pattern 28b, thereby increasing the capacitance and the operation reliability of the capacitor 90.

Figure 5A:
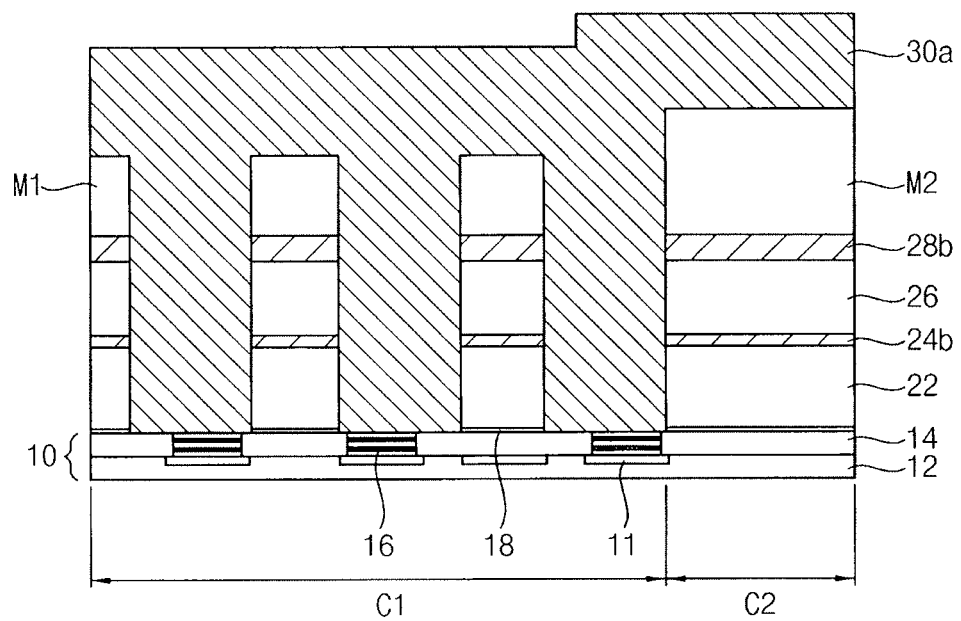
FIGS. 5A to 5C illustrate cross-sectional views of stages in a method of forming a capacitor for semiconductor devices in accordance with embodiments.
Figure 5B:
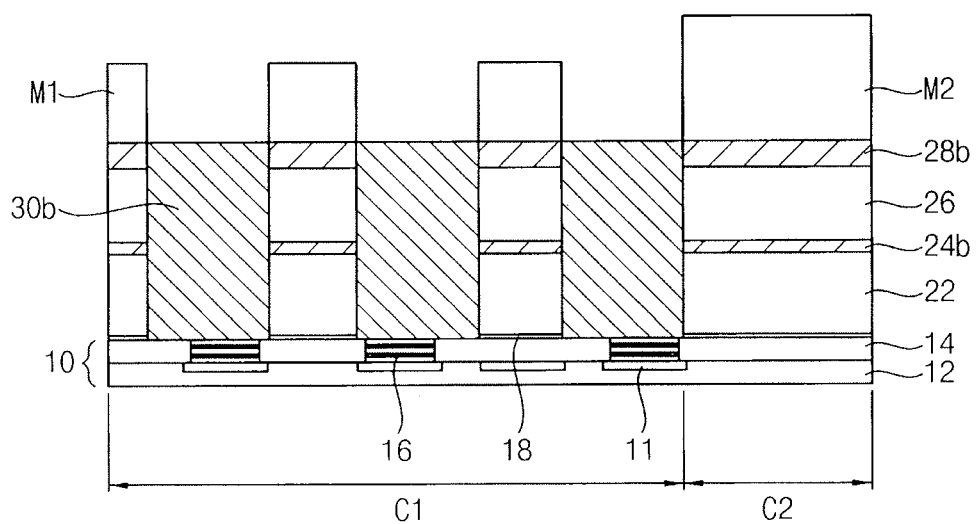
Figure 5C:
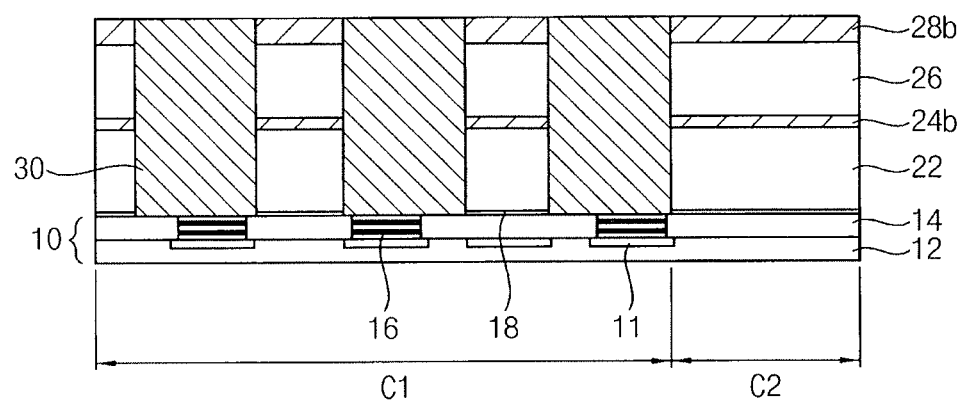

FIGS. 5A to 5C are cross-sectional views illustrating stages in a method of forming a capacitor for semiconductor devices in accordance with a second example embodiment.

Referring to FIG. 5A, the lower electrode layer 30a may be formed on the whole surface of the substrate 10 and the mask pattern M may be covered with the lower electrode layer 30a by the same processes as described in detail with reference to FIGS. 1A to 1C.

Referring to FIG. 5B, the lower electrode layer 30*a* may be partially removed from the substrate 10 by an etching process, thereby forming the electrode pattern 30*b* that may be separated by the contact hole H. For example, a wet etching process using the LPSPM as an etchant may be conducted on the lower electrode layer 30*a*, and the lower electrode layer 30*a* may be removed more than the mask pattern M, thereby forming the electrode pattern 30*b* that may be arranged in the contact hole H.

Since polysilicon may have high etching selectivity with respect to conductive metal in the LPSPM, the lower electrode layer 30*a* including the conductive metal may be removed more than the mask pattern M including the polysilicon. Thus, the lower electrode layer 30*a* may be etched off from the substrate 10 without a substantial etching to the mask pattern M.

A relative height of the electrode pattern 30*b* with respect to the second support pattern 28*b* may be changed just by controlling a terminal point of the wet etching process. In the present example embodiment, the upper surface of the electrode pattern 30*b* may be equal to or higher than the upper surface of the second support pattern 28*b*.

When the upper surface of the electrode pattern 30*b* has the same level as the upper surface of the second support pattern 28*b*, the lower electrode 30 in FIG. 4C may be coplanar with the upper surface of the second support pattern 28*b*, so that a surface profile of the lower electrode 30 and the second support pattern 28*b* may be flat or even. In contrast, when the upper surface of the electrode pattern 30*b* may be higher than the upper surface of the second support pattern 28*b*, the lower electrode 36 may protrude from the upper surface of the second support pattern 28*b*, so that a surface profile of the lower electrode 36 and the second support pattern 28*b* may be uneven, as is illustrated in FIGS. 2A to 2C.

Referring to FIG. 5C, the mask pattern M may be removed from the substrate 10, thereby exposing the second support pattern 28*b* and forming the electrode pattern 30*b* into the lower electrode 30 in the contact hole H.

The mask pattern M may be removed from the substrate 10 by a planarization process on condition that the second support pattern 28*b* may not be damaged in the planarization process as described in detail with reference to FIG. 1F. For example, the RDC process may be conducted on the mask pattern M using removal radicals in such a way that the polysilicon of the mask pattern M may be selectively removed with respect to the silicon nitride of the second support pattern 28*b*. Thus, the height of the second support pattern 28*b* may be maintained unchanged in the RDC process and the second support pattern 28*b* may also have the same thickness as the second support layer 28*a*.

Thereafter, the dielectric layer 40 and the upper electrode 50 may be formed by the same processes as described in detail with reference to FIGS. 1G to 1J, thereby forming the capacitor 90 on the substrate 10. The lower electrode layer 30*a* may be formed into the electrode pattern 30*b* by an etching process without any damages to the second support pattern 28*b*, thereby preventing the thickness or the height of the uppermost support in the formation process of the lower electrode. Accordingly, the lower electrode 30 may be formed to be as high as possible and the capacitance of the capacitor 90 may sufficiently increase although the critical dimension (CD) of the semiconductor device may decrease.

FIGS. 6A to 6D are cross-sectional views illustrating stages in a method of forming a capacitor for semiconductor devices in accordance with a third example embodiment.

Figure 6A:
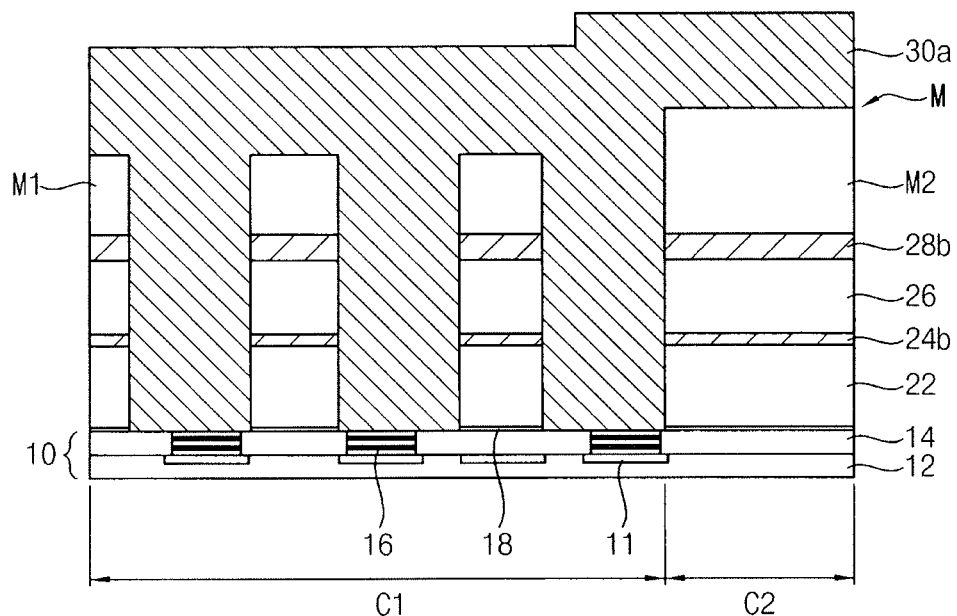
FIGS. 6A to 6D illustrate cross-sectional views of stages in a method of forming a capacitor for semiconductor devices in accordance with embodiments.

Referring to FIG. 6A, the lower electrode layer 30*a* may be formed on the whole surface of the substrate 10 and the mask pattern M may be covered with the lower electrode layer 30*a* by the same processes as described in detail with reference to FIGS. 1A to 1C.

Figure 6B:
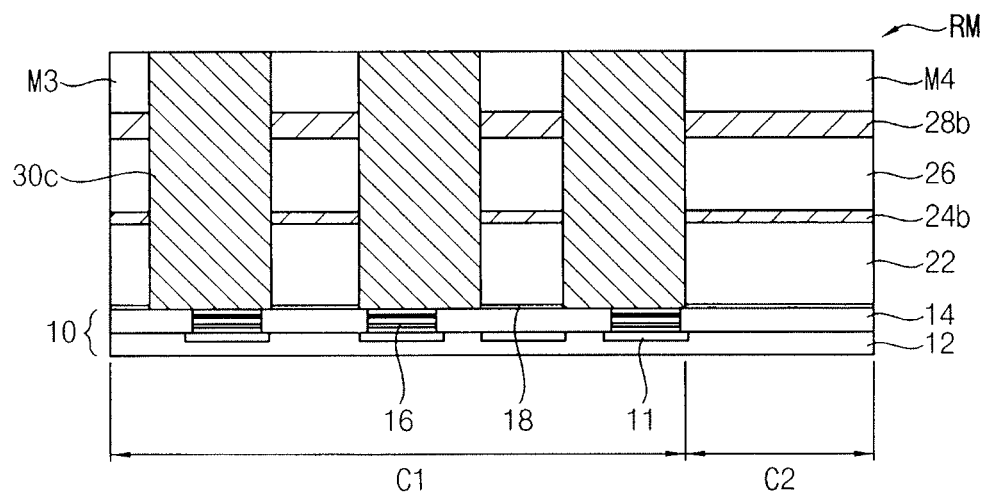

Referring to FIG. 6B, the lower electrode layer 30*a* and the mask pattern M may be planarized until the top surface of the lower electrode layer 30*a* and the top surface of the mask pattern M may be coplanar with each other. Thus, the lower electrode layer 30*a* may be formed into a preliminary electrode pattern 30*c* that may remain only in the contact hole H and the mask pattern M may be formed into the residual mask RM that may cover the second support pattern 28*b* in the cell area C1 and the core area C2.

For example, a chemical mechanical polishing (CMP) process may be conducted along the cell area C1 and the core area C2 of the substrate 10 in such a way that the lower electrode layer 30*a* and the mask pattern M may be simultaneously removed from the substrate 10 and the lower electrode layer 30*a* and the mask pattern M may have the same level. For that reason, the CMP process may be conducted by using polishing slurry by which both of the lower electrode layer 30*a* and the mask pattern M may be simultaneously polished and removed from the substrate 10. In such a case, the upper surface of the preliminary electrode pattern 30*c* and the upper surface of the residual mask RM may be sufficiently higher than the upper surface of the second support pattern 28*b*, so that the second support may be prevented from being damaged in the CMP process.

Since the CMP process may be conducted more rapidly than subsequent processes to the preliminary electrode pattern 30*c* and the residual mask RM, the preliminary electrode pattern 30*c* and the residual mask RM may be formed to a thickness as small as possible for a short time as long as the second support pattern 28*b* may not be damaged in the CMP process. Thus, the process time for forming the electrode pattern 30*b* and the process time for removing the residual mask RM may be reduced since the preliminary electrode pattern 30*c* and the residual mask RM may be sufficiently reduced in the CMP process. Accordingly, an overall process time for forming the lower electrode 30 in FIG. 5D may be reduced by the CMP process.

Accordingly, the preliminary electrode pattern 30*c* and the residual mask RM may be planarized in such a way that the upper surfaces of the preliminary electrode pattern 30*c* and the residual mask RM may be approximate to the upper surface of the second support pattern 28*b* as much as possible as long as the second support pattern 28*b* may not be damaged in the CMP process, thereby decreasing the process time of the subsequent processes to the preliminary electrode pattern 30*c* and the residual mask RM.

Figure 6C:
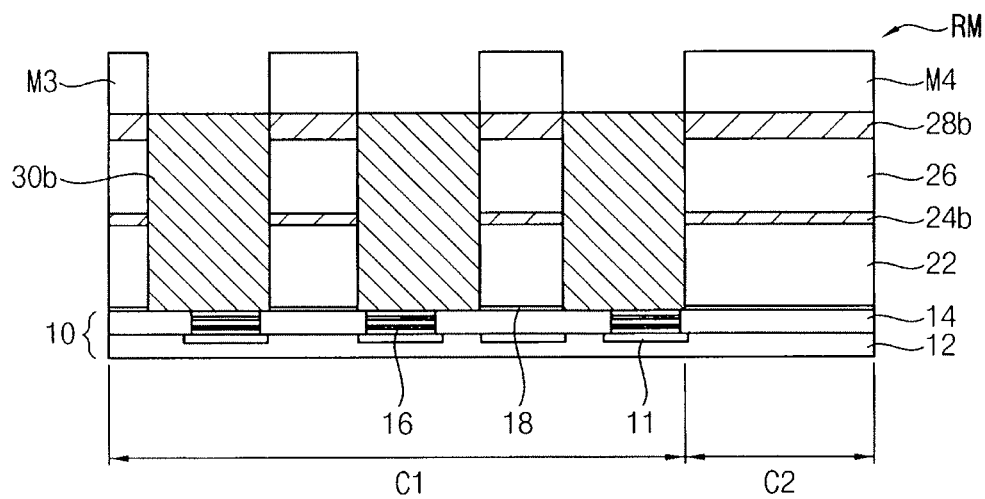

Referring to FIG. 6C, an upper portion of the preliminary electrode pattern 30*c* may be removed from the substrate 10, thereby forming the electrode pattern 30*b* in the contact hole H. The second support pattern 28*b* may be still covered with the residual mask RM.

For example, an upper portion of the preliminary electrode pattern 30*c* may be selectively removed from the substrate 10 with respective to the residual mask RM by a wet etching process using the LPSPM as an etchant. Thus, an upper surface of the electrode pattern 30*b* may be lower than that of the residual mask RM and the contact hole H may be filled with the electrode pattern 30*b*.

In such a case, a relative height of the electrode pattern 30*b* with respect to the second support pattern 28*b* may be changed just by controlling a terminal point of the wet etching process. The upper surface of the electrode pattern 30b may be equal to or higher than the upper surface of the second support pattern 28b.

In the present example embodiment, the upper surface of the electrode pattern 30b may have the same level as the upper surface of the second support pattern 28b and the lower electrode 30 may be coplanar with the upper surface of the second support pattern 28b. In contrast, when the upper surface of the electrode pattern 36b may be higher than the upper surface of the second support pattern 28b, the lower electrode 30 may protrude from the upper surface of the second support pattern 28b, so that a surface profile of the lower electrode 30 and the second support pattern 28b may be uneven, as is illustrated in FIGS. 2A to 2C.

Figure 6D:
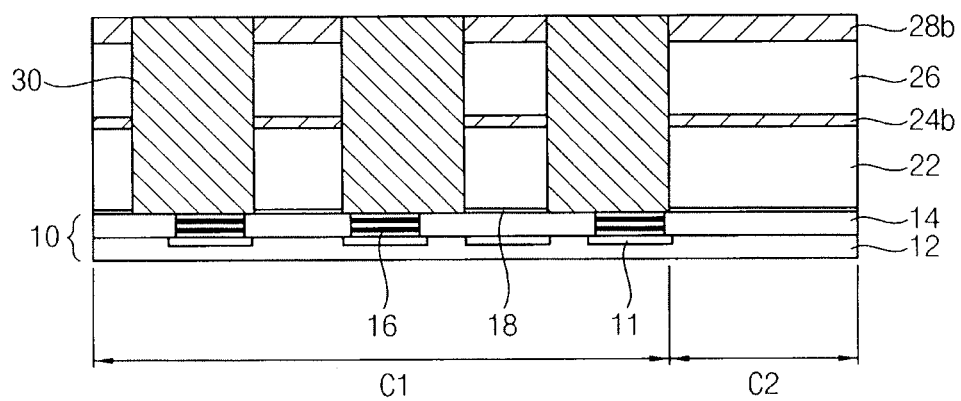

Referring to FIG. 6D, the residual mask RM may be removed from the substrate 10, thereby exposing the second support pattern 28b and forming the electrode pattern 30b into the lower electrode 30 in the contact hole H.

For example, the RDC process may be conducted on the residual mask RM using removal radicals in such a way that the polysilicon of the residual mask RM may be selectively removed with respect to the silicon nitride of the second support pattern 28b. Accordingly, the second support pattern 28b may be exposed to surroundings along a whole surface of the substrate 10 and the lower electrode 30 may be arranged through the second support pattern 28b in the cell area C1. The lower electrode 30 may make contact with the interconnector 16 in the contact holes H. Particularly, no substantial damages to the second support pattern 28b may occur in the RDC process, so the height of the second support pattern 28b may be substantially unchanged in the RDC process. Thus, the second support pattern 28b may also have the same thickness as the second support layer 28a. The RDC process may be conducted in the same way as described with reference to FIG. 1F, and thus any detailed descriptions on the RDC process is omitted in the present example embodiment. Thereafter, the dielectric layer 40 and the upper electrode 50 may be formed by the same processes as described in detail with reference to FIGS. 1G to 1I, thereby forming the capacitor 90 on the substrate 10.

Both of the lower electrode layer 30a and the mask pattern M may be simultaneously planarized by the CMP process in such a way that the upper surfaces of the preliminary electrode pattern 30c and the residual mask RM may be approximate to the upper surface of the second support pattern 28b as much as possible as long as the second support pattern 28b may not be damaged in the CMP process, thereby decreasing the etching time of the wet etching process to the preliminary electrode pattern 30c and the cleaning time of the RDC process to the residual mask RM. Accordingly, the overall process time for forming the capacitor may be sufficiently reduced due to the process time decrease for forming the lower electrode 30.

Figure 7A:
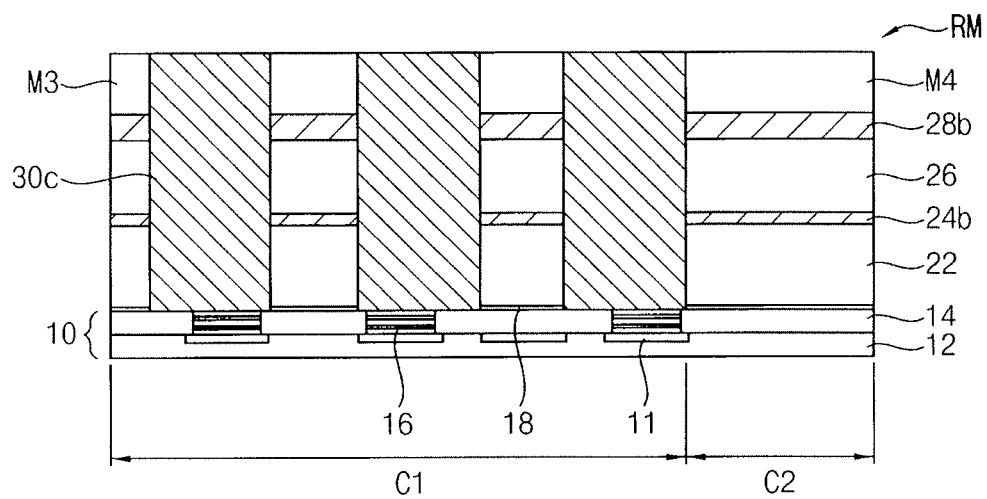
FIGS. 7A to 7C illustrate cross-sectional views of stages in a modified method of forming the capacitor in accordance with embodiments.
Figure 7B:
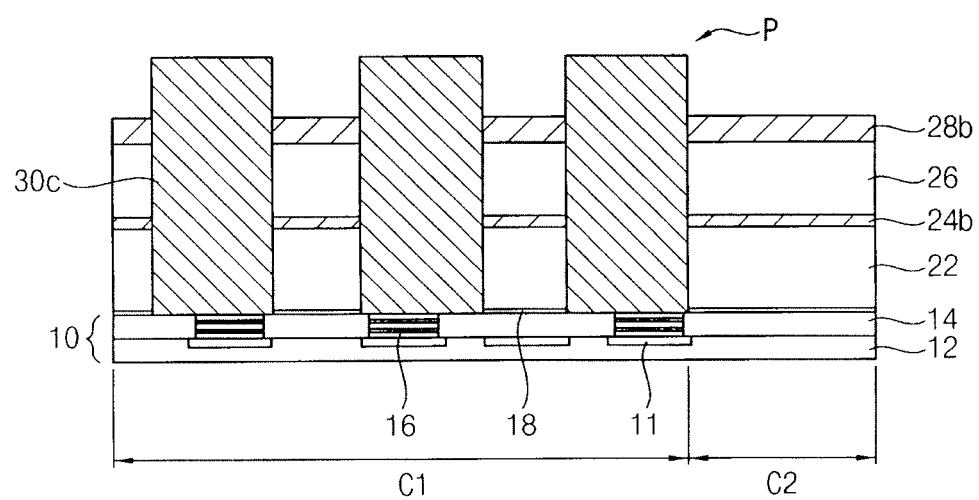
Figure 7C:
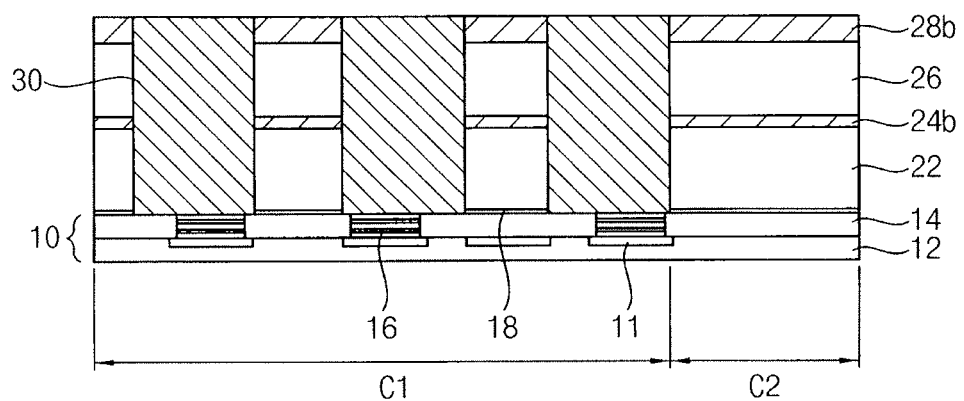

FIGS. 7A to 7C are cross-sectional views illustrating stages in a modified method of forming the capacitor in accordance with the third example embodiment.

Referring to FIG. 7A, the lower electrode layer 30a may be formed on the whole surface of the substrate 10 in such a way that the mask pattern M may be covered with the lower electrode layer 30a, and the lower electrode layer 30a and the mask pattern M may be planarized until the top surface of the lower electrode layer 30a and the top surface of the mask pattern M may be coplanar with each other by the same processes as described with reference to FIGS. 6A and 6B, thereby forming the preliminary electrode pattern 30c that may remain only in the contact hole H and the residual mask RM that may cover the second support pattern 28b in the cell area C1 and the core area C2.

For example, the lower electrode layer 30a and the mask pattern M may be removed by a first CMP process having a first polishing rate, to thereby form the preliminary electrode pattern 30c and the residual mask RM. The first polishing rate of the first CMP process may be greater than a second polishing rate of a second CMP process that will be described in detail hereinafter with reference to FIG. 7C. Therefore, the process time for forming the preliminary electrode pattern 30c and the residual mask RM may be sufficiently reduced by the relatively rapid first CMP process.

Referring to FIG. 7B, the residual mask RM may be removed from the substrate 10, thereby exposing the second support pattern 28b and the preliminary electrode pattern 30c such that the preliminary electrode pattern 30c may protrude from the second support pattern 28b.

For example, the RDC process may be conducted on the residual mask RM using removal radicals in such a way that the polysilicon of the residual mask RM may be selectively removed with respect to the silicon nitride of the second support pattern 28b and the conductive materials of the preliminary electrode pattern 30c. Accordingly, the preliminary electrode pattern 30c and the second support pattern 28b may be exposed to surroundings along a whole surface of the substrate 10. Particularly, the preliminary electrode pattern 30c and the second support pattern 28b may not be damaged occur in the RDC process, so the height of the second support pattern 28b may be substantially unchanged in the RDC process. Thus, the second support pattern 28b may also have the same thickness as the second support layer 28a. The RDC process may be conducted in the same way as described with reference to FIG. 1F, and thus any detailed descriptions on the RDC process is omitted in the present example embodiment. Accordingly, the preliminary electrode pattern 30c may be arranged into a matrix shape in the cell area C1 together with protruding from the second support pattern 28b.

Referring to FIG. 7C, an upper portion of the preliminary electrode pattern 30c may be removed from the substrate 10, thereby forming the lower electrode 30. When the preliminary electrode pattern 30c excessively protrudes from the second support pattern 28b, a focusing error may occur in a subsequent photolithography process for forming a dielectric layer on the lower electrode 30.

For example, the upper portion of the preliminary electrode pattern 30c may be selectively removed from the substrate 10 with respect to the second support pattern 28b by a wet etching process using the LPSPM as an etchant as described with reference to FIG. 1E. In such a case, a relative height of the lower electrode 30 with respect to the second pattern 28b may be changed just by controlling a terminal point of the wet etching process. In the present example embodiment, the upper surface of the electrode pattern 30b may have the same level as the upper surface of the second support pattern 28b and the lower electrode 30 may be coplanar with the upper surface of the second support pattern 28b.

However, when the upper surface of the preliminary electrode pattern 30c is higher than the upper surface of the second support pattern 28b, the lower electrode 30 may protrude from the upper surface of the second support pattern 28b and a surface profile of the lower electrode 30 and the second support pattern 28b may be uneven, as illustrated in FIGS. 2A to 2C. A protrusion of the lower electrode 30 may be allowable on condition that the focusing margin for the subsequent photolithography process for forming a dielectric layer on the lower electrode 30 may not be deteriorated.

In a modified example embodiment, the upper portion of the preliminary electrode pattern 30c may be removed by a second CMP process having a second polishing rate smaller than the first polishing rate. The second support pattern 28b may function as a polishing stopper for the second CMP process. Thus, the preliminary electrode pattern 30c may be formed into the lower electrode 30 that may be coplanar with the second support pattern 28b.

The second CMP process may be performed by using such a slurry that the second support pattern 28b may be sufficiently resistive to the slurry and the preliminary electrode pattern 30c may be sufficiently well polished by the slurry. In addition, the second CMP may be performed at such a sufficiently low polishing rate that the losses or the damages to the second support pattern 28b may be sufficiently prevented in the second CMP process. Accordingly, the height of the second support pattern 28b may be unchanged during the formation of the lower electrode 30 and the second support pattern 28b may have substantially the same thickness or the height as the second support layer 28a. Thus, the thickness or the height of the lower electrode 30 may be maximized in the cell area C1.

Thereafter, the dielectric layer 40 and the upper electrode 50 may be formed by the same processes as described in detail with reference to FIGS. 1G to 1J, thereby forming the capacitor 90 on the substrate 10.

Figure 8A:
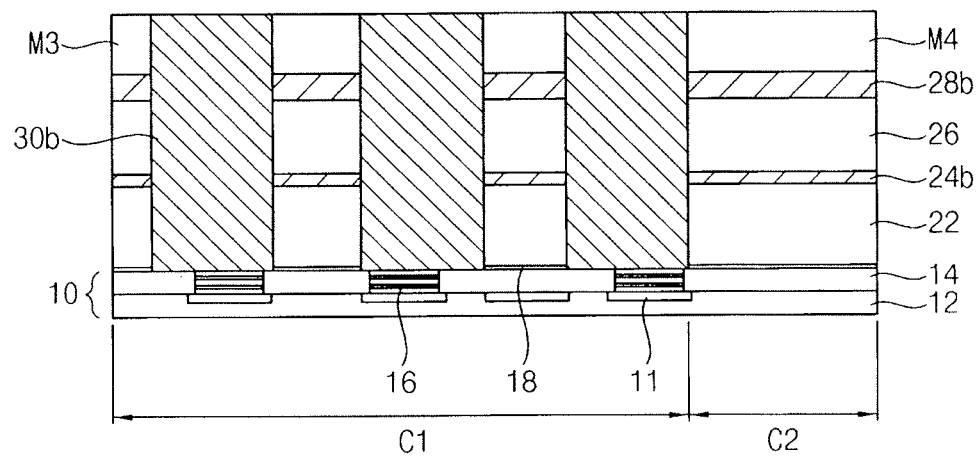
FIGS. 8A to 8B illustrate cross-sectional views of stages in a modified method of forming the capacitor in accordance with embodiments.
Figure 8B:
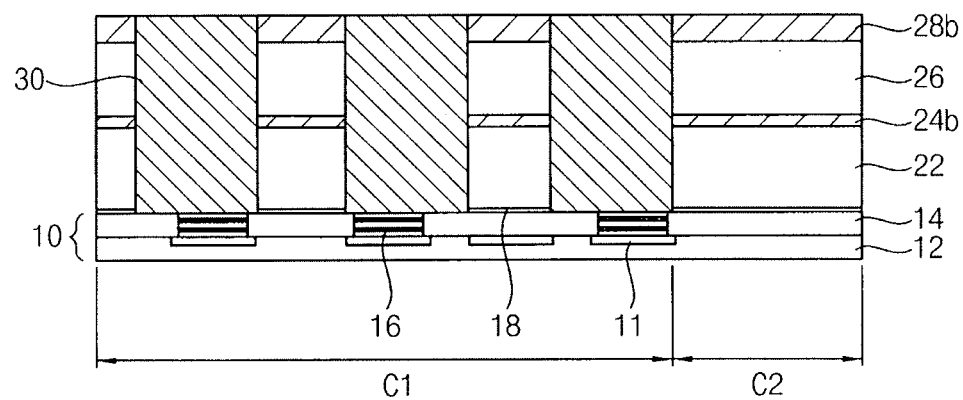

FIGS. 8A to 8B illustrate cross-sectional views of stages in another modified method of forming the capacitor in accordance with the third example embodiment.

Referring to FIG. 8A, the lower electrode layer 30a may be formed on the whole surface of the substrate 10 in such a way that the mask pattern M may be covered with the lower electrode layer 30a by the same process as described in detail with references to FIGS. 1A to 1C, and the lower electrode layer 30a and the mask pattern M may be planarized until the top surface of the lower electrode layer 30a and the top surface of the mask pattern M may be coplanar with each other, thereby forming the electrode pattern 30b filling up the contact hole H and the residual mask RM covering the second support pattern 28b in the cell area C1 and the core area C2.

For example, the lower electrode layer 30a and the mask pattern M may be removed by the first CMP process at a first polishing rate that is described in detail with reference to FIG. 7A, to thereby form the electrode pattern 30b and the residual mask RM.

A first slurry may be provided onto the lower electrode layer 30a and the lower electrode 30a and the mask pattern M may be polished in the first CMP process at the first polishing rate. Therefore, the process time for forming the electrode pattern 30b and the residual mask RM may be sufficiently reduced by the first CMP process having a relatively higher polishing rate. The electrode pattern 30b may fill up the contact hole H and an upper surface of the electrode pattern 30b may be coplanar with an upper surface of the residual mask RM. The second support pattern 28b may be still covered with the residual mask RM in the cell area C1 and the core area C2. Particularly, the upper surfaces of the electrode pattern 30b and the residual mask RM may be sufficiently higher than an upper surface of the second support pattern 28b just by controlling the first slurry and the polishing conditions of the first CMP process.

Particularly, since the residual mask RM may have a sufficient thickness and may cover the second support pattern 28b, the second support pattern 28b may be sufficiently protected in the first CMP process although the first polishing rate of the first CMP process may be relatively high.

Referring to FIG. 8B, an upper portion of the electrode pattern 30b and the residual pattern RM may be simultaneously removed by a second CMP process at a second polishing rate smaller than the first polishing rate.

A second slurry to which the second support pattern 28b may be sufficiently resistive may be provided onto the electrode pattern 30b and the residual mask RM and the second CMP process may be relatively slowly conducted to the electrode pattern 30b and the residual mask RM at the second polishing rate.

Therefore, the residual mask RM may be removed from the second support pattern 28b without any substantial losses or damages to the second support pattern 28b and an upper portion of the electrode pattern 30b may be removed in such a way that an upper surface of the electrode pattern 30b may be coplanar with the top surface of the second support pattern 28b, thereby forming a lower electrode 30 in the contact hole H that may be coplanar with the second support pattern 28b while the height of the second support pattern 28b may be maintained unchanged in the CMP process and the second support pattern 28b may have the same thickness as the second support layer 28a.

The first slurry may be identical to or different from the second slurry according the polishing characteristics of the first and the CMP processes. In the present example embodiment, the first slurry may have the same compositions as the second slurry. In such a case, the second CMP process may be consecutively conducted after the first CMP process just by reducing the first polishing rate to the second polishing rate.

Since the first CMP process for forming the electrode pattern 30b and the residual mask RM may be relatively rapidly conducted while the second support pattern 28b may be protected in the first CMP by the residual mask RM and the second CMP process for forming the lower electrode 30 may be relatively slowly conducted without substantial damages to the second support pattern 28b, the lower electrode 30 may be efficiently formed in the contact hole H without any damages to the second support pattern 28b.

Thereafter, the dielectric layer 40 and the upper electrode 50 may be formed by the same processes as described in detail with reference to FIGS. 1G to 1J, thereby forming the capacitor 90 on the substrate 10.

FIGS. 9A to 9D are cross-sectional views illustrating stages in a method of forming a capacitor for semiconductor devices in accordance with a fourth example embodiment.

Figure 9A:
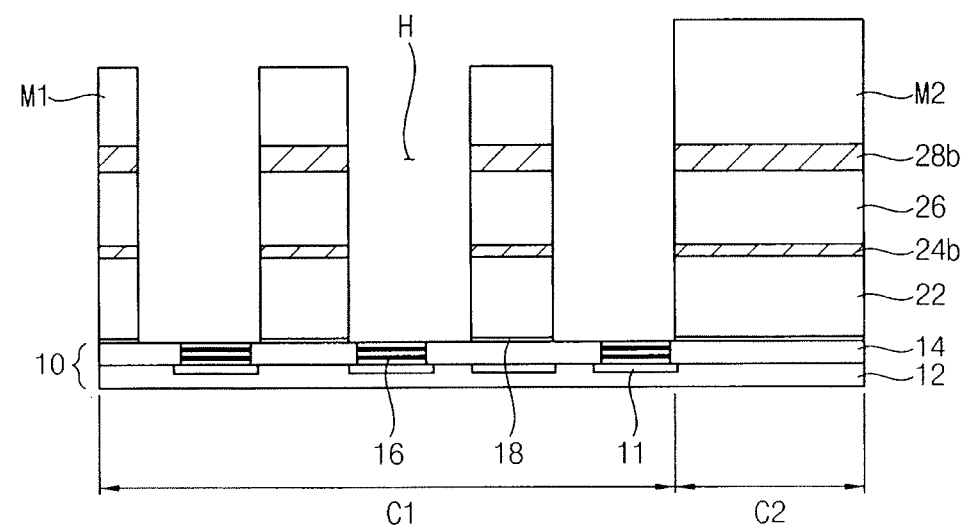
FIGS. 9A to 9D illustrate cross-sectional views of stages in a method of forming a capacitor for semiconductor devices in accordance with embodiments.

Referring to FIG. 9A, the first and the second mold layers 22a and 26a and the first and the second support layers 24a and 28a may be partially removed from the substrate 10, thereby forming the contact hole H through which the interconnector 16 may be exposed in the cell area C1 of the substrate 10 by the same processes as describe with reference to FIGS. 1A and 1B. Thus, the first and the second mold layers 22a and 26a may be formed into a first mold pattern 22 and a second mold pattern 26, respectively, and the first and the second support layers 24a and 28a may be formed into a first support pattern 24b and a second support pattern 28b, respectively. Particularly, the first and the second mold layers 22a and 26a may include an oxide without boron (B) so as to prevent the first and the second mold patterns 22 and 26 from being removed in a subsequent process for removing the mask pattern M.

In the present example embodiment, the compositions of the first and the second mold patterns 22 and 26 may be selected as materials having a sufficient etch selectivity with respect to the polysilicon of the mask pattern M, so that the first and the second mold patterns 22 and 26 may include an oxide in which boron (B) may not be included. Thus, when the mask pattern M includes other materials except for polysilicon, the compositions of the first and the second mold patterns 22 and 26 may also be varied according to the materials of the mask pattern M.

Figure 9B:
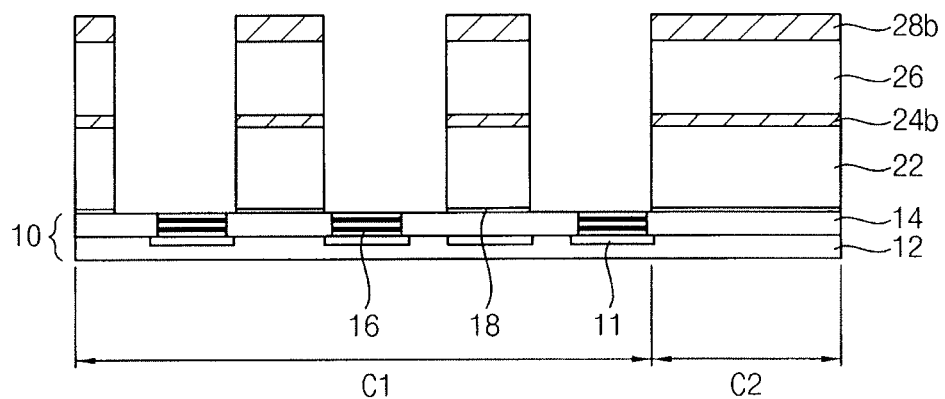

Referring to FIG. 9B, the mask pattern M may be removed from the substrate 10 in such a way that no damage occur to the second support pattern 28b.

For example, the mask pattern M may be removed from the substrate 10 by a planarization process by which the second support pattern 28b may not be damaged, as described with reference to FIG. 1F. In the present example embodiment, the RDC process may be conducted on the residual mask RM using removal radicals in such a way that the polysilicon of the residual mask RM may be selectively removed with respect to the silicon nitride of the second support pattern 28b. Accordingly, the second support pattern 28b may be exposed to surroundings along a whole surface of the substrate 10 and the interconnectors 16 may be exposed through the contact hole H.

The first and the second mold patterns 22 may be exposed in the contact hole H and thus 26 may also experience the RDC process. However, the removal radicals of the RDC process may selectively react to polysilicon, and the oxides of the first and the second mold patterns 22 and 26 may not react with the removal radicals. Particularly, boron-based oxides may react with the removal radicals for removing polysilicon in the RDC process, so the first and the second mold patterns 22 and 26 may include an oxide having no boron (B). Accordingly, the mask pattern M may be removed from the substrate 10 without substantial damage to the first and the second support patterns 24b and 28b and to the first and the second mold patterns 22 and 26. Particularly, since the thickness of the second support pattern 28b may be unchanged in spite of the RDC process for removing the mask pattern M, the lower electrode 30 in FIG. 7D may be formed to be as high as possible.

Figure 9C:
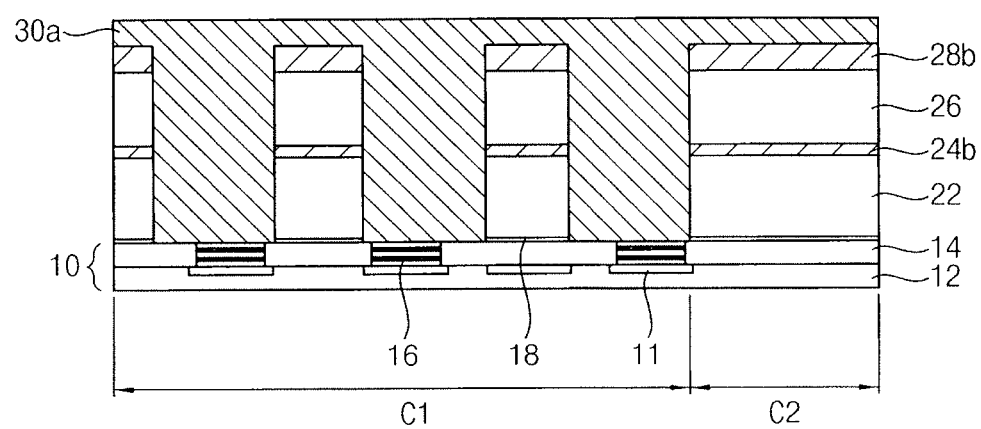

Referring to FIG. 9C, the lower electrode layer 30a may be formed on the substrate 10 to a sufficient thickness to fill up the contact hole H and to cover the second support pattern 28b. For example, conductive materials may be deposited onto the substrate 10 to a sufficient thickness to fill up the contact hole H by a chemical vapor deposition (CVD) process, thereby forming the lower electrode layer 30a making contact with the interconnector 16. The CVD process for forming the lower electrode layer 30a may be the same as the CVD process described with reference to FIG. 1C.

Particularly, since the lower electrode layer 30a may be formed on the substrate 10 after removing the mask pattern M, deposition defects, e.g., void defects and/or seam defects, may be sufficiently reduced, e.g., as compared to a lower electrode layer formed through a mask. Since the mask pattern M may not be positioned on the second support pattern 28b, the aspect ratio of the contact hole H may be reduced, e.g., as compared to an aspect ratio resulting when the mask pattern M is positioned on the second support pattern 28b. Thus, deposition defects may be reduced in the lower electrode layer 30a due to the reduced aspect ratio of the contact hole H.

Figure 9D:
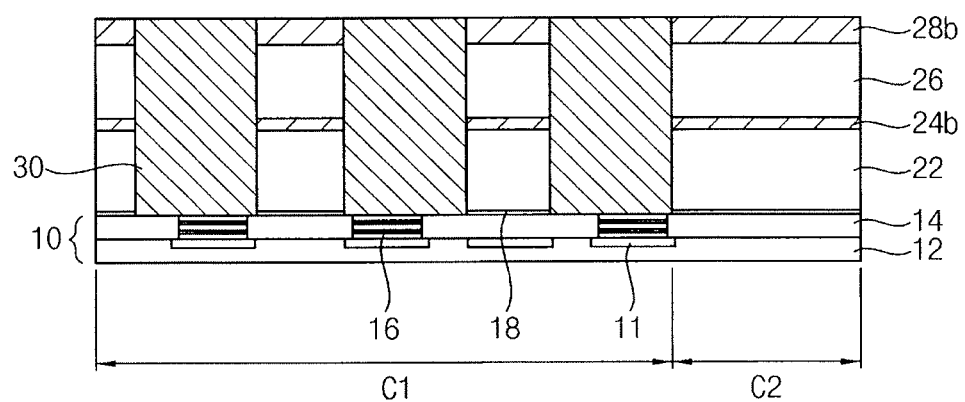

Referring to FIG. 9D, the lower electrode layer 30a may be partially removed from the substrate 10 at an etching selectivity with respect to the second support pattern 28b. Portions of the lower electrode layer 30a may remain only in the contact hole H, thereby forming the lower electrode 30 in contact with the interconnector 16 in the contact hole H.

Particularly, the removal process for the lower electrode layer 30a may be conducted principally on the lower electrode layer 30a without damage to the second support pattern 28b. Therefore, the height or the thickness of the second support pattern 28b may be substantially unchanged in the planarization process. Thus, the lower electrode 30 may be formed in such a configuration that an upper surface of the lower electrode 30 may be coplanar with an upper surface of the second support pattern 28b.

For example, a CMP process may be conducted to the lower electrode layer 30a by using such a slurry that the second support pattern 28b may be sufficiently resistive to the slurry and the lower electrode layer 30a may be sufficiently well polished by the slurry. Thus, the lower electrode layer 30a may be formed into the lower electrode 30 that may fill up the contact hole H and be coplanar with the second support pattern 28b. Since no damages or losses to the second support pattern 28b may occur in the CMP process, the second support pattern 28b may have substantially the same thickness as the second support layer 28a. Accordingly, the height reduction of the lower electrode 30 caused by the thickness reduction of the second support pattern 28b may be sufficiently prevented.

In addition, the lower electrode layer 30a may also be removed by an etch back process as long as no damages to the second support pattern 28b may occur in the etch back process.

Further, a wet etching process using the LPSPM as an etchant may be conducted on the lower electrode layer 30a until an upper surface of the second support pattern 28b may be exposed. In the wet etching process using the LPSPM as an etchant, the conductive materials of the lower electrode layer 30a may be etched off from the substrate 10 at a high etch selectivity with respect to the second support pattern 28b until an upper surface of the second support pattern 28b may be exposed. That is, the second support pattern 28b may function as an etch stopper for the wet etching process using the LPSPM as an etchant.

Accordingly, the lower electrode 30 may be formed in the contact holes H in such a configuration that the upper surface of the lower electrode 30 may be coplanar with the upper surface of the second support pattern 28b. Since no damages or losses to the second support pattern 28b may occur in the formation process of the lower electrode 30, the height reduction of the lower electrode 30 caused by the thickness reduction of the second support pattern 28b may be sufficiently prevented.

Thereafter, the dielectric layer 40 and the upper electrode 50 may be formed by the same processes as described in detail with reference to FIGS. 1G to 1J, thereby forming the capacitor 90 on the substrate 10.

Since the mask pattern M may be removed from the substrate without substantial damages to the second support pattern 28b and the first and the second mold patterns 22 and 26 and the lower electrode layer 30a may formed into the lower electrode 30 without substantial damages to the second support pattern 28b, the height or the thickness of the second support pattern 28b may be unchanged in the removal process of the mask pattern M and the node-separation process of the lower electrode layer 30a. Accordingly, since the height of the lower electrode 30 may be determined by the second support pattern 28b, which may be formed into an uppermost support in a subsequent process, the height of the lower electrode 30 may be formed to be as high as possible in spite of the removal process of the mask pattern M and the node-separation process to the lower electrode layer 30.

Figure 10:
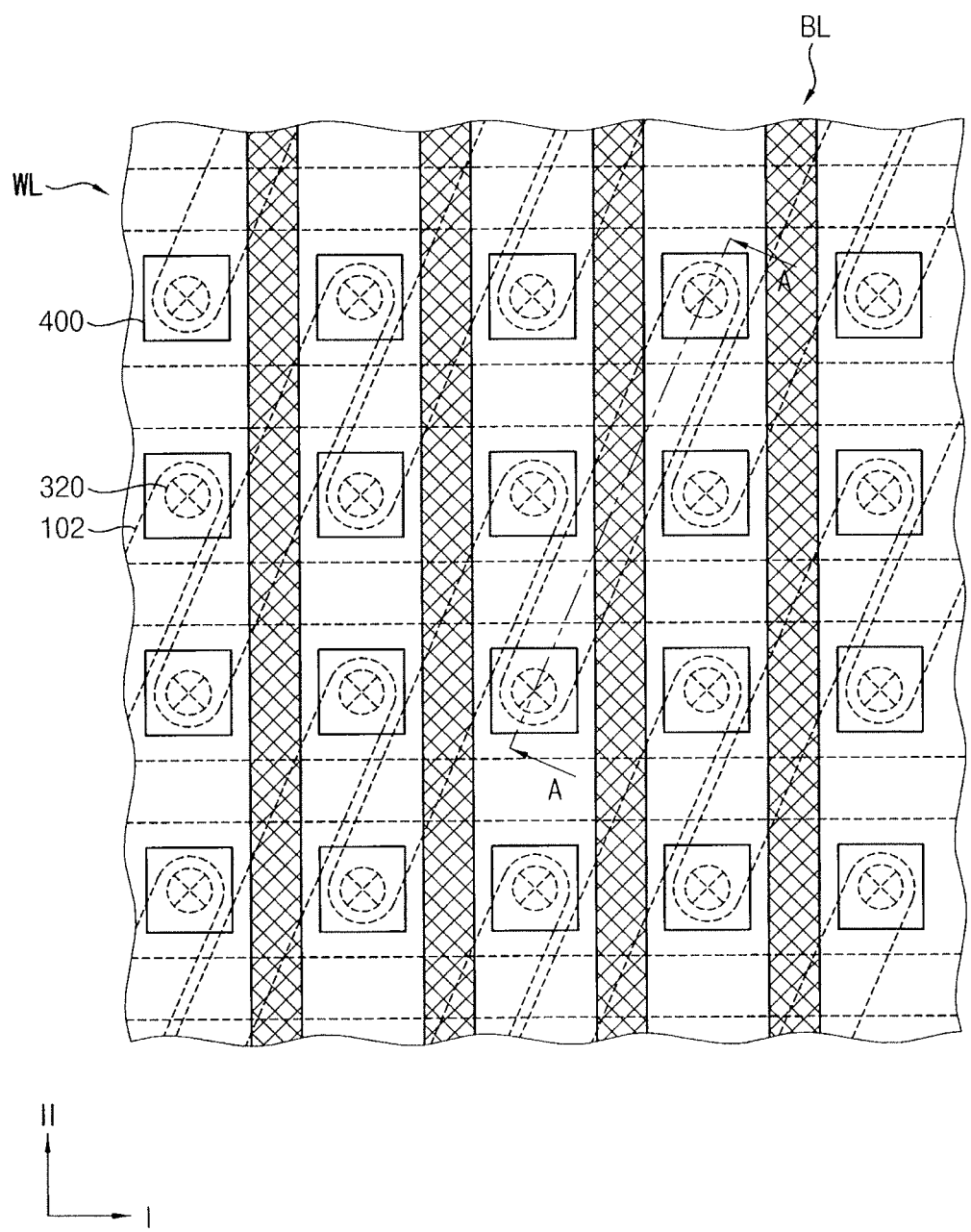
FIG. 10 illustrate a plan view of a semiconductor device having the capacitor shown in FIG. 2A to 2C.

FIG. 10 is a plan view illustrating a semiconductor device having a capacitor shown in FIG. 2A to 2C, and FIG. 11 is a cross-sectional view cut along a line A-A of FIG. 10.

Figure 11:
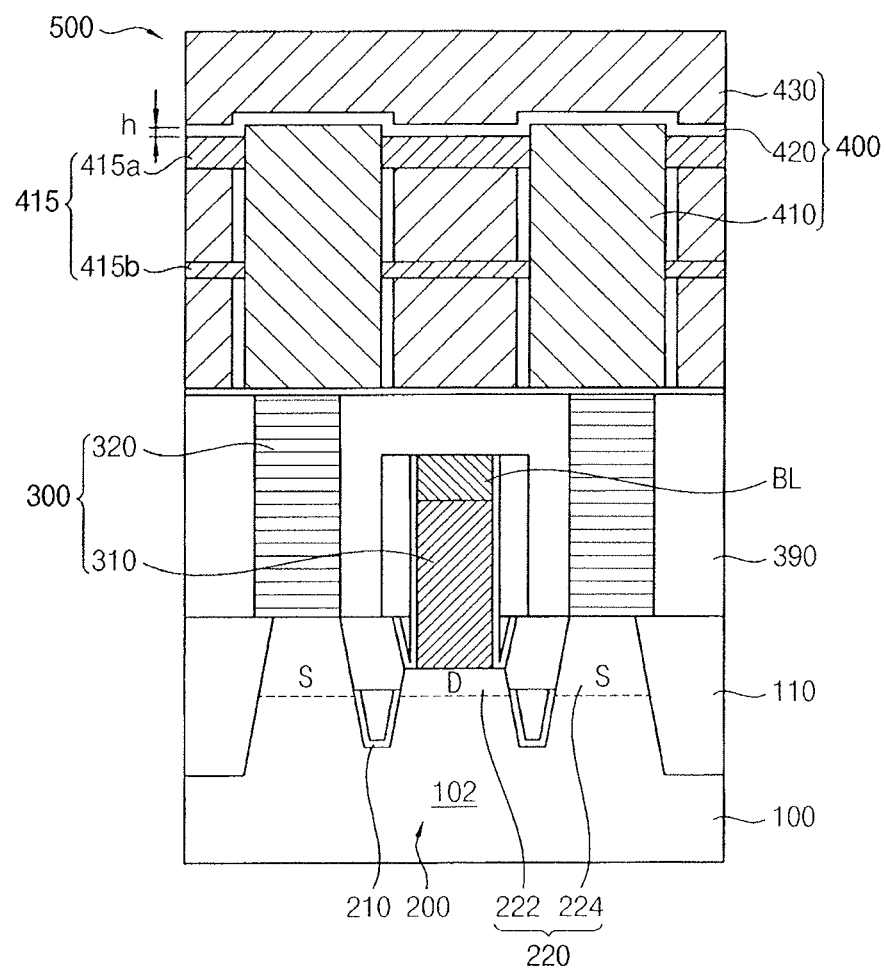
FIG. 11 illustrates a cross-sectional view along line A-A in FIG. 10.

Referring to FIGS. 10 and 11, a semiconductor device 500 in accordance with an example embodiment may include a substrate 100, a memory cell structure 200 arranged on the substrate 100, an interconnector 300 connected to the memory cell structure, and a charge storage structure, i.e., a capacitor 400, connected to the interconnector and selectively storing electric charges. The capacitor 400 may include a lower electrode 410 that may be connected to the interconnector 300 and may be supported by at least a support 415, a dielectric layer 420 covering surfaces of the lower electrode 410 and an upper surface of the support 415, and an upper electrode 430 on the dielectric layer 420. Particularly, the lower electrode 410 may protrude from the support 415.

For example, the substrate 100 may include a semiconductor substrate, e.g., a silicon (Si) substrate, a germanium (Ge) substrate, a silicon-on-insulator (SOI) substrate, and a germanium-on-insulator (GOI) substrate, and a glass substrate on which a plurality of thin film transistors (TFT) for a flat panel display device may be arranged.

The substrate 100 may include an active region 102 on which a plurality of conductive structures, e.g., gate electrodes, may be arranged, and a field region 104 defining the active region 102. A device isolation layer 110 may be arranged on the field region 104, so the conductive structures on the neighboring active regions 102 may be electrically isolated from each other by the device isolation layer 110.

In the present example embodiment, the active region 102 may be slanted with respect to a first direction I or a second direction II at a slant angle (FIG. 10), and a plurality of the active regions 102 may be arranged with the same gap distance in the first and the second directions I and II. The slant arrangement of the active regions 102 may increase a cell density of the substrate 100 with a sufficient gap distance between the neighboring active regions 102.

In the present example embodiment, a pair of gate lines may cross a single active region 102 in the first direction I and a single bit line may cross a single active region 102 in the second direction II, so that a plurality of word lines WL of the semiconductor 500 may extend in the first direction I and a plurality of the bit lines BL of the semiconductor 500 may extend in the second direction II. The bit line BL may cross the active region 102 at a central portion and the word line WL may cross the active region 102 between the central portion and an end portion. Thus, a pair of the word lines WL and a single bit line BL may cross each other at a single active region 102.

Referring to FIG. 11, the memory cell structure 200 may include a buried gate 210 of which the top portion may be under a top surface of the substrate 100 and a junction area 220 of which the top portion may be above the top portion of the buried gate 210. A gate trench may be provided in the cell area along the first direction I, so the gate trench may cross the active region 102 and the device isolation layer 110 alternately with each other in the first direction I. The buried gate 210 may be arranged in the gate trench, and may be provided as the word line WL in the first direction I.

For example, the buried gate 210 may include a gate insulation layer on bottom and side surfaces of the gate trench, a gate conductive layer on the gate insulation layer and filling a lower portion of the gate trench and a gate capping pattern on the gate conductive layer and filling up an upper portion of the gate trench.

A pair of the buried gates may be positioned in a single active region 102 and the portions of the active region 102 on which the buried gates may not be positioned may be provided as the junction area 220. Since a pair of the word lines WL that may be spaced apart by a gap distance may cross the single active region 102, the junction area 220 may be provided at a central portion and both ends portions of the active region 102. That is, a central portion and both end portions may be provided as the junction area 220 in a single active region 102. In the present example embodiment, the central portion of the active region 102 may be recessed to a some depth and may be provided as a first junction 222 and both end portions of the active region 102 may have the same level as the top surface of the substrate 100 and may be provided as a pair of second junctions 224.

Some impurities may be implanted onto the junction area 220 and source and drain electrodes S and D may be provided in every active region 102, so the buried gate and the source and drain electrodes S and D may be provided as a cell transistor. That is, a pair of the cell transistors may be provided at a single active region 102.

The first junction 222 may be recessed downwards from the top surface of the substrate 100, so that the top portion of the first junction 222 may be lower than a top surface of the device isolation layer 110. A bit line contact 310 may be electrically connected the first junction 222 and the bit line BL may be connected to the first junction 222 via the bit line contact 310.

The second junction 224 may have the same surface level as the device isolation layer 110, so the surface level of the second junction 224 may be higher than that of the first junction 222. A storage contact 320 may be connected to the first junction 224 and the capacitor 400 may be electrically connected to the second junction 224 via the storage contact 320. Thus, the semiconductor device 500 may include the buried gate 210 and the source and drain electrodes S and D at the junction area 220 in a cell area of the substrate 100 as a buried channel array transistors (BCAT) structure.

The interconnector 300 may include the bit line contact 310 in contact with the bit line BL and the storage contact 320 in contact with the capacitor 400. In the present example embodiment, the bit line contact 310 may be provided as a direct contact (DC) making direct contact with the bit line BL in the same insulation interlayer 390, and the storage contact 320 may be provided as a buried contact (BC) buried in the insulation interlayer 390 and making contact with the capacitor 400 through the insulation interlayer 390.

The bit line BL may extend in the second direction II and may be simultaneously connected to a plurality of the first junctions 222 that may be arranged in a line along the second direction II. A plurality of the bit lines BL may be arranged in the first direction I with the same gap distance. Thus, a pair of the second junctions 224 may be positioned at both sides of each bit line BL.

In the present example embodiment, the bit line BL may be provided as a gate bit line (GBL) in which a top surface of the bit line BL may be coplanar with a bottom surface of a peripheral gate structure (not shown). The peripheral gate structure may be arranged in a core area or a peripheral area of the substrate 100.

The storage contact 320 may be connected with the capacitor 400 and the second junction 224. A plurality of the storage contacts 320 may be arranged between the bit lines in a matrix shape along the first and the second directions I and II.

The storage contacts 320 may be electrically isolated from one another by the insulation interlayer 390 and the capacitor 400 may be arranged on the insulation interlayer 390. The storage contact 320 may be contact with the second junction 224 through the insulation interlayer 390 and an upper surface of the storage contact 320 may be coplanar with an upper surface of the insulation interlayer 390. Thus, the storage contact 320 may be contact with the lower electrode 410 of the capacitor 400 that may be arranged on the insulation interlayer 390. A landing pad may be further provided between the storage contact 320 and the capacitor 400 so as to increase the contact area between the storage contact 320 and the capacitor 400.

The capacitor 400 may be connected to the memory cell structure 200 and electric charges may be selectively charged into or discharged from the capacitor 400. In the present example embodiment, the capacitor 400 may include a plurality of lower electrodes 410 that may be connected to the interconnectors 300, respectively, and may be supported by at least a support 415, a dielectric layer 420 covering surfaces of the lower electrode 410 and an upper portion of the support 415, and an upper electrode 430 on the dielectric layer 420.

In the present example embodiment, the lower electrode 410, the support 415, the dielectric layer 420, and the upper electrode 430 may be formed in the same process as described with reference to FIGS. 2A to 2C, and the capacitor 400 may include the capacitor 90 in which the lower electrode may protrude from the uppermost support 28.

Thus, the support 415 may include an upper support 415a supporting a top portion of the lower electrode 410 and a lower support 415b supporting a middle portion of the lower electrode 410. In addition, the upper electrode 430 may be arranged in the upper space US and the lower space LS as well as on the lower electrode 410, so that the upper electrode 430 may face side surfaces of the lower electrode 410 in the upper and lower spaces US and LS as well as face the upper surface of the lower electrode 410, thereby increasing the capacitance of the capacitor 400. Particularly, the lower electrode 410 may protrude from a top surface of the upper support 415a to a protrusion height h, so that the height of the lower electrode 410 may increase as high as the protrusion height h.

In such a case, the protrusion height h may be formed to be as high as possible as long as the focusing margin of the subsequent photolithography process may not be deteriorated. Thus, the capacitance of the capacitor 400 may increase according to the height increase of the lower electrode 410. Accordingly, the lower electrode 410 may protrude from the uppermost support 415 and the capacitance of the capacitor 400 may also be increased as much as the protrusion height h of the lower electrode 410. In addition, the node-separation process for forming the lower electrode 410 and the RDC process for removing the mask pattern M may be conducted in such a condition that the uppermost support 415 may be sufficiently protected, so the thickness of the uppermost support 415 may be maintained unchanged in the node-separation process and the RDC process. Thus, the lower electrode 410 may be formed to be as high as possible due to the no thickness reduction of the uppermost support 415, thereby sufficiently increasing the capacitance of the capacitor 400.

By way of summation and review, when a lower electrode of a capacitor of a DRAM device is formed to be as high as possible, the support pattern for supporting a lower electrode pattern may be partially removed from the substrate in an etching process for forming the lower electrode pattern. As a result, an overall height of the lower electrode may be limited within a certain height due to the partial removal of the support pattern.

In contrast, example embodiments provide a method of manufacturing a semiconductor device in which the lower electrode of the capacitor is formed without damage to the support pattern. That is, according to example embodiments, the lower electrode of a capacitor for semiconductor devices may be formed without substantial damages to the uppermost support pattern, so the uppermost support for supporting the top portion of the lower electrode may be prevented from thickness reduction. Since the height of the lower electrode is changed by the thickness of the uppermost support, the height of the lower electrode may also be formed to be sufficiently high, thereby sufficiently increasing the capacitance of the capacitor. For example, the lower electrode may be formed to be higher than the uppermost support just by controlling a dry etch-back process, so the lower electrode may protrude from the uppermost support. Thus, the height of the lower electrode may increase as high as the protrusion height, and the capacitance of the capacitor may increase due to the height increase of the lower electrode.

That is, according to embodiments, the lower electrode layer is formed on the substrate prior to the removal of the mask pattern. That is, the mask pattern for forming the contact hole may be covered by the lower electrode layer. Then, the lower electrode layer is formed into the lower electrode in the contact hole by a dry etch-back and a wet etching process using an LPSPM as an etchant, and then the mask pattern is removed from the support pattern by a RDC process. Accordingly, any substantial damages to the support pattern does not occur in the dry etch-back process, the wet etching process using an LPSPM as an etchant, and the RDC process, because the support pattern is covered by the mask pattern until the node-separation process is completed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
  sequentially forming a mold layer, a support layer, and a mask pattern on a whole surface of a substrate, the substrate having a cell area defined by a core area, and a lower conductive structure and at least one interconnector in contact with the lower conductive structure being on the cell area of the substrate under the mold layer;
  partially removing the support layer and the mold layer by an etching process using the mask pattern as an etching mask to form a mold pattern and a support pattern on the mold pattern, such that a contact hole is formed through the support pattern and the mold pattern to expose the at least one interconnector in the cell area;

forming a lower electrode layer on the mask pattern to fill the contact hole and to cover the mask pattern;

forming an electrode pattern in the contact hole by removing a portion of the lower electrode layer, such that a top surface of the electrode pattern is lower than that of the mask pattern; and forming a lower electrode for a capacitor in the contact hole by removing a portion of the electrode pattern and by exposing the support pattern having a substantially same thickness as the support layer such that the lower electrode is supported by the support pattern and is in contact with the interconnector.

2. The method as claimed in claim 1, wherein:

forming the electrode pattern is performed by a dry etch-back process in such a way that the lower electrode layer and the mask pattern are partially removed from the substrate to form a residual mask on the support pattern together with the electrode pattern that is higher than the support pattern and lower than the residual mask.

3. The method as claimed in claim 2, wherein forming the lower electrode includes:

removing the portion of the electrode the electrode by a wet etching process using a low peroxide sulfuric acid-hydrogen peroxide mixture (LPSPM) as an etchant such that an upper surface of the electrode pattern is substantially coplanar with that of the support pattern; and removing the residual mask by a radical dry cleansing (RDC) process from the support pattern to expose the support pattern and to form the lower electrode in the contact hole that is substantially at a same level with the support pattern.

4. The method as claimed in claim 2, wherein the electrode pattern includes at least a recess recessed from an upper surface of thereof, and further comprising forming an additional conductive layer on the electrode pattern and the residual mask such that the recess is filled with the additional conductive layer; and forming an additional second electrode pattern in the recess by removing a portion of the additional conductive layer by a dry etch-back process such that the additional conductive layer and the residual mask are partially removed from the substrate to form a modified electrode pattern including the additional electrode pattern filling in the recess and a reduced residual mask.

5. The method as claimed in claim 1, wherein:

forming the electrode pattern is performed by a wet etch process by using a low peroxide sulfuric acid-hydrogen peroxide mixture (LPSPM) as an etchant such that the lower electrode layer is separated by the contact hole and the contact hole is filled with the electrode pattern while the support pattern is still covered with the mask pattern.

6. The method as claimed in claim 1, wherein forming the electrode pattern is performed by a first planarization process to the lower electrode layer and the mask pattern at a first rate, such that the lower electrode layer and the mask pattern are simultaneously removed from the substrate to form the residual mask covering the support pattern together with the electrode pattern filling the contact hole and an upper surface of the electrode pattern is coplanar with an upper surface of the residual mask.

7. The method as claimed in claim 6, wherein forming the lower electrode includes:

removing the portion of the electrode pattern by a wet etching process using a low peroxide sulfuric acid-hydrogen peroxide mixture (LPSPM) as an etchant such that an upper surface of the electrode pattern is coplanar with an upper surface of the support pattern; and removing the residual mask by a radical dry cleaning (RDC) process from the support pattern to expose the support pattern and to form the lower electrode in the contact hole that is substantially at a same level with the support pattern.

8. A method of manufacturing a semiconductor device, the method comprising:

sequentially forming a mold layer having no boron (B), a support layer, and a mask pattern on a whole surface of a substrate, the substrate having a cell area defined by a core area, and at least one lower conductive structure and at least one interconnector in contact with the lower conductive structure being on the cell area of the substrate under the mold layer;

partially removing the support layer and the mold layer by an etching process using the mask pattern as an etching mask to form a mold pattern and a support pattern on the mold pattern, such that a contact hole is formed through the support pattern and the mold pattern and the interconnector is exposed through the contact hole in the cell area;

removing the mask pattern from the support pattern by a radial dry cleaning (RDC) process;

forming a lower electrode layer on the support pattern to fill the contact hole; and forming a lower electrode for a capacitor in contact with the interconnector in the contact hole by partially removing the lower electrode layer.

9. The method as claimed in claim 8, wherein partially removing the lower electrode layer is conducted by a wet etching process using a low peroxide sulfuric acid-hydrogen peroxide mixture (LPSPM) as an etchant, such that an upper surface of the lower electrode is coplanar with an upper surface of the support pattern.

10. The method as claimed in claim 8, wherein partially removing the lower electrode layer is conducted by a chemical mechanical polishing (CMP) process using a slurry to which the support pattern is sufficiently resistive and by which the lower electrode layer is sufficiently polished.

11. The method as claimed in claim 2, wherein forming the lower electrode includes:

removing the portion of the electrode pattern by a wet etching process using a low peroxide sulfuric acid-hydrogen peroxide mixture (LPSPM) as an etchant such that an upper surface of the electrode pattern is still higher than the support pattern; and removing the residual mask by a radical dry cleansing (RDC) process from the support pattern to expose the support pattern to form the lower electrode protruding from above the support pattern.

12. The method as claimed in claim 11, after removing the residual mask from the substrate, further comprising:

planarizing the electrode pattern higher than the support pattern until the electrode pattern is coplanar with the support pattern by a chemical mechanical polishing (CMP) process to form the lower electrode such that an upper surface of the lower electrode is substantially coplanar with that of the support pattern.

13. The method as claimed in claim 4, wherein forming the lower electrode includes:

removing the portion of the modified electrode pattern including the additional electrode pattern by a wet etching process using a low peroxide sulfuric acid-hydrogen peroxide mixture (LPSPM) as an etchant such that an upper surface of the modified electrode pattern is substantially coplanar with that of the support pattern; and removing the reduced residual mask by a radical dry cleaning (RDC) process from the support pattern to expose the support pattern and to form the lower electrode in the contact hole that is substantially at a same level with the support pattern.

14. The method as claimed in claim 5, wherein an upper surface of the electrode pattern is substantially coplanar with that of the support pattern, and forming the lower electrode includes:

removing the mask pattern by a radical dry cleansing (RDC) process from the support pattern to expose the support pattern and to form the lower electrode in the contact hole that is substantially at a same level with the support pattern.

15. The method as claimed in claim 5, wherein an upper surface of the electrode pattern is higher than that of the support pattern, and forming the lower electrode includes:

removing the mask pattern by a radical dry cleansing (RDC) process from the support pattern to expose the support pattern such that the electrode pattern is protruded from above the support pattern; and planarizing the electrode pattern higher than the support pattern until the electrode pattern is coplanar with the support pattern by a chemical mechanical polishing (CMP) process to form the lower electrode in the contact hole that is substantially at a same level with the support pattern.

16. The method as claimed in claim 6, wherein forming the lower electrode includes:

removing the residual mask by a radical dry cleaning (RDC) process from the support pattern to expose the support pattern such that the electrode pattern is protruded from above the support pattern; and removing the portion of the electrode pattern by a wet etching process using a low peroxide sulfuric acid-hydrogen peroxide mixture (LPSPM) as an etchant such that an upper surface of the electrode pattern is coplanar with an upper surface of the support pattern to form the lower electrode in the contact hole that is substantially at a same level with the support pattern.

17. The method as claimed in claim 6, wherein forming the lower electrode includes:

removing the residual mask by a radical dry cleaning (RDC) process from the support pattern to expose the support pattern such that the electrode pattern is protruded from above the support pattern; and planarizing the electrode pattern higher than the support pattern until the support pattern is exposed and the electrode pattern is coplanar with the support pattern by a second planarization process at a second rate smaller than the first rate, to form the lower electrode in the contact hole that is substantially at a same level with the support pattern (Embodiment 7 #2).

18. The method as claimed in claim 17, wherein the first planarization process and the second planarization process includes a chemical mechanical polishing process.

19. The method as claimed in claim 6, wherein forming the lower electrode includes:

simultaneously removing the portion of the electrode pattern and the residual mask by a second planarization process at a second rate smaller than the first rate until the support pattern is exposed and the electrode pattern is coplanar with the support pattern, to form the lower electrode in the contact hole that is substantially at a same level with the support pattern.

20. The method as claimed in claim 19, wherein the first planarization process and the second planarization process includes a chemical mechanical polishing (CMP) process.

* * * * *